(12) United States Patent
Ueno et al.

(10) Patent No.: US 9,252,381 B2
(45) Date of Patent: Feb. 2, 2016

(54) ORGANIC ELECTRONIC DEVICE AND METHOD FOR PRODUCING THE SAME

(75) Inventors: Shigehiro Ueno, Tokyo (JP); Masato Okada, Tokyo (JP); Makoto Komukai, Tokyo (JP); Masato Asou, Tokyo (JP); Takeshi Matsuhashi, Tokyo (JP); Kazunari Ikeda, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 1043 days.

(21) Appl. No.: 13/378,812

(22) PCT Filed: Jun. 18, 2010

(86) PCT No.: PCT/JP2010/060345
§ 371 (c)(1),
(2), (4) Date: Dec. 16, 2011

(87) PCT Pub. No.: WO2010/147205
PCT Pub. Date: Dec. 23, 2010

(65) Prior Publication Data
US 2012/0091448 A1    Apr. 19, 2012

(30) Foreign Application Priority Data

Jun. 19, 2009   (JP) .................................. 2009-145949
Jun. 15, 2010   (JP) .................................. 2010-136061

(51) Int. Cl.
*H01L 51/50* (2006.01)
*H01L 51/00* (2006.01)

(52) U.S. Cl.
CPC .......... *H01L 51/506* (2013.01); *H01L 51/5088* (2013.01); *H01L 51/0038* (2013.01); *H01L 51/0059* (2013.01); *H01L 51/0081* (2013.01); *H01L 51/0085* (2013.01); *H01L 51/5052* (2013.01); *H01L 51/5056* (2013.01)

(58) Field of Classification Search
CPC .... H01L 51/50; H01L 51/506; H01L 51/5088
USPC ............. 428/690; 427/66, 203, 205; 313/506; 257/40; 252/518.1, 519.3; 136/263
See application file for complete search history.

(56) References Cited

U.S. PATENT DOCUMENTS

| | | | |
|---|---|---|---|
| 6,468,675 B1 * | 10/2002 | Ishikawa et al. ............. | 428/690 |
| 7,201,859 B2 * | 4/2007 | Lee et al. ...................... | 252/500 |
| 2007/0085472 A1 * | 4/2007 | Yamakawa et al. ........... | 313/504 |
| 2008/0278064 A1 * | 11/2008 | Kumaki et al. ............... | 313/504 |
| 2011/0163327 A1 | 7/2011 | Ueno et al. | |
| 2011/0220853 A1 * | 9/2011 | Yoshimoto et al. ........ | 252/519.3 |
| 2012/0211705 A1 | 8/2012 | Ueno et al. | |

FOREIGN PATENT DOCUMENTS

| | | |
|---|---|---|
| EP | 2 276 087 | 1/2011 |
| EP | 2 355 197 | 8/2011 |
| JP | 1-252666 | 10/1989 |
| JP | 2824411 | 9/1998 |
| JP | 11-60602 | 3/1999 |
| JP | 11-74079 | 3/1999 |
| JP | 2002-204012 | 7/2002 |
| JP | 2005-8441 | 1/2005 |
| JP | 2005-44615 | 2/2005 |
| JP | 3748110 | 12/2005 |
| JP | 2006-155978 | 6/2006 |
| JP | 2007-180526 | 7/2007 |
| JP | 2007-287586 | 11/2007 |
| JP | 2008-41894 | 2/2008 |
| WO | 2010/058776 | 5/2010 |
| WO | 2010/058777 | 5/2010 |
| WO | WO 2010058776 A1 * | 5/2010 ............. H05B 33/14 |

OTHER PUBLICATIONS

Clemente-Leon, M.; Ito, T.; Yashiro, H; Yamase, T; Coronado, E.; Langmuir 2007, 23, 4042-4047.*
Akutagawa, T.; Jin, R.; Tunashima, R.; Noro, S.; Cronin, L.; Nakamura, T.; Langmuir 2008, 24, 231-238.*
Liu, S.; Kurth, D.; Mohwald, H.; Volkmer, D.; Advanced Materials 2002, 14, No. 3, Feb. 5, 225-228.*
Coronado, E.; Gomez-Garcia, C.; Chemical Reviews 1998, 98, 273-296.*
Pastor, N.; Gomez-Romero, P.; Frontiers in Bioscience, 2004, 9, 1759-1770.*
Coronado, E.; Galan-Mascaros, J.; Gimenez-Saiz, C.; Gomez-Garcia, C.; Martinez-Ferrero, E.; Almeida, M.; Lopes, E.; Capelli, S.; Llusar, R.; Journal of Materials Chemistry, 2004, 14, 1867-1872.*
Tao et al., Anthracene derivative for a non-doped blue-emitting organic electroluminescence device with both excellent color purity and high efficiency, Sep. 12, 2004, Chemical Physics Letters, 397, pp. 1-4.*
Talham, Conducting and Magnetic Langmuir-Blodgett Films, Oct. 23, 2004, Chemical Reviews, 104, pp. 5479-5501.*
International Preliminary Report on Patentability issued Jan. 26, 2012 in International (PCT) Application No. PCT/JP2010/060345.
Extended European Search Report issued Jun. 28, 2013 in corresponding European patent application No. 10 78 9578.
Sang-Yoon Oh et al., "Self-assembled monolayers of diamine molecules and phosphomolybdic acid on an ITO surface", New Journal of Chemistry, vol. 28, No. 4, Mar. 1, 2004, pp. 495-501, XP055067688.

(Continued)

*Primary Examiner* — Jennifer Chriss
*Assistant Examiner* — Dylan Kershner
(74) *Attorney, Agent, or Firm* — Wenderoth, Lind & Ponack, L.L.P.

(57) ABSTRACT

There is provided an organic electronic device that can exhibit a long lifetime while having a facilitated production process. An organic electronic device and a method for producing it, wherein the organic electronic device comprises two or more electrodes facing each other on a substrate, and an organic functional layer that includes at least a hole injecting layer and/or a hole transporting layer situated between two electrodes, wherein the hole injecting layer and/or hole transporting layer is formed as a thin-film from a fluid material that comprises anionic metal oxide clusters that include at least one metal element selected from among elements of Group 5, Group 6 or Groups 8-10 of the Periodic Table, the metal oxide clusters being polyoxometalates, dissolved or uniformly dispersed or mixed in an aqueous solvent.

15 Claims, 2 Drawing Sheets

(56) References Cited

OTHER PUBLICATIONS

Antonios M. Douvas et al., "Polyoxometalate-Based Layered Structures for Charge Transport Control in Molecular Devices", ACS NANO, vol. 2, No. 4, Mar. 18, 2008, pp. 733-742, XP055067638.
Glezos N., et al., "Electrical characterization of molecular monolayers containing tungsten polyoxometalates", Microelectronic Engineering, Elsevier Publishers BV., Amsterdam, NL, vol. 83, No. 4-9, Mar. 3, 2006, pp. 1757-1760, XP024955164.
Velessiotis D., et al., "Tungstate polyoxometalates as active components of molecular devices", Journal of Applied Physics, American Institute of Physics, New York, US, vol. 98, No. 8, Oct. 18, 2005, pp. 84503-084503, XP012078842.
International Search Report issued Jul. 20, 2010 in International (PCT) Application No. PCT/JP2010/060345.
Q. Pei et al., "Solid state polymer light-emitting electrochemical cells: Recent developments" Synthetic Metals, 1997, vol. 85, pp. 1229-1232.

* cited by examiner

ORGANIC ELECTRONIC DEVICE AND METHOD FOR PRODUCING THE SAME

TECHNICAL FIELD

The present invention relates to an organic electronic device and a method for producing it, and particularly it relates to an organic electronic device and a method for producing it, which encompass a wide range of basic elements and uses such as organic luminescent devices including organic electroluminescence elements, or organic transistors, organic solar cells and the like, and also quantum dot light emitting elements having hole injecting transport layers, and oxide-based compound solar cells.

BACKGROUND ART

Organic electronic devices employing organic materials are expected to be developed for a wide range of basic elements and uses including organic electroluminescence elements (hereunder, "organic EL elements"), organic transistors and organic solar cells. In addition, "organic devices", in the wider sense of having a hole injecting transporting layer, include quantum dot light emitting elements in which organic EL luminescent dopants are replaced with inorganic semiconductor nanoparticles.

Organic EL elements are charge injecting-type self-luminous devices utilizing luminescence produced during recombination of electrons and holes that have reached the luminescent layer.

The element structure of an organic EL element is cathode/luminescent layer/anode. In order to obtain high luminous efficiency in an organic EL element it is necessary to efficiently and rapidly supply electrical charges (holes and electrons) to the luminescent material acting as the luminescent center, but due to a high energy barrier between the anode or cathode and the organic functional layer, such as the luminescent layer, injection of electrical charges is not easily accomplished. For this reason, the energy barrier between the electrode and organic functional layer has conventionally been lowered by optimizing the work function of the anode or cathode, which is accomplished by adding a charge transport material to the luminescent layer, forming a hole transporting layer between the anode and the luminescent layer, or forming an electron transporting layer between the cathode and the luminescent layer. In the original organic EL elements, therefore, the organic functional layer containing the luminescent layer usually had a two-layer structure comprising a luminescent layer and a hole injecting layer, or a three-layer structure comprising an electron transporting layer, a luminescent layer and a hole transporting layer.

Several multilayer structures have recently been proposed, including the 5-layered structure: electron injecting layer/electron transporting layer/luminescent layer/hole transporting layer/hole injecting layer, with the aim of obtaining high luminous efficiency and long lifetime.

These layers other than luminescent layers, such as the electron injecting layer, electron transporting layer, hole transporting layer and hole injecting layer, are considered to have effects of facilitating injecting and transport of electrical charge into the luminescent layer, or effects of blocking to maintain balance between the electron current and hole current, or effects of preventing diffusion of light energy excitons.

In addition to organic EL elements, organic solar cells may be mentioned as examples of organic electronic devices using organic materials with a certain level of carrier mobility.

The most basic structure of an organic solar cell is one wherein an organic thin-film with the same two-layer structure as an organic EL element is sandwiched between electrodes. The photocurrent produced by absorption of light into the organic thin-film can be utilized to obtain electromotive force. The current that flows may be considered to be flow of the carrier produced by light utilizing the carrier mobility of the organic material. If the charge injecting barrier between the organic material and the electrode can be reduced, it is possible to obtain more efficient electromotive force. This is, in a sense, a mechanism opposite of that of an organic EL element.

An organic transistor is another example of an organic electronic device. An organic transistor is a thin-film transistor that uses an organic semiconductor material composed of a π-conjugated organic high molecular or organic low molecular compound in the channel region. Common organic transistors comprise a substrate, a gate electrode, a gate insulating layer, a source/drain electrode and an organic semiconductor layer. In an organic transistor, the voltage applied to the gate electrode (gate voltage) is varied to control the charge at the interface between the gate insulating film and organic semiconductor film, and the current value between the source electrode and drain electrode is varied for switching.

When organic semiconductor materials employed in such organic transistors are used, however, the charge injecting barrier with the source electrode or drain electrode has been large, causing problems with element driving. It is expected that reducing the charge injecting barrier between the organic semiconductor layer and the source electrode or drain electrode will improve the on-state current value for organic transistors and stabilize element characteristics.

On the other hand, in regard to methods for producing organic electronic devices involving formation of luminescent layers or charge transport layers, there have been proposed methods for producing organic electronic devices such as organic EL elements having a luminescent layer or charge transport layer formed by a vapor deposition method such as vacuum vapor deposition or ion sputtering, or a coating method in which an organic material having luminescence or a charge transport property is dissolved, dispersed or mixed with a solvent and applied onto a substrate to form a coating film (spin coating, printing, ink-jet methods and the like).

For production of organic electronic devices, coating methods, involving application onto a substrate with or without a solvent, have advantages over vapor deposition methods such as vacuum vapor deposition, in that they do not require large vapor deposition apparatuses and allow the fabrication process to be simplified, while also having high material utilization efficiency and low cost, and permitting large-area substrates to be processed. In addition, because materials can be separately applied in parallel, such as for RGB in organic EL elements, there are significant advantages to forming organic electronic devices by coating methods.

Anions such as sulfate ion, or cations, have been removed in some cases (Patent document 1) for the purpose of extending the life of polythiophenesulfonic acid (PEDOT/PSS), as a hole injecting material with satisfactory film formability by coating and high charge transporting capacity and charge injecting capacity.

Strategies aimed at obtaining a hole injecting layer with satisfactory injecting properties and electrical charge mobility include creating a hole injecting layer by forming a thin-film by a vapor deposition method using a transition metal oxide such as vanadium pentaoxide or molybdenum trioxide (Patent documents 2-4), creating a hole injecting layer by forming a mixed film by covapor deposition with molybdenum trioxide (MoO$_3$) and an amine-based low molecular compound (NPD) (Patent documents 5 and 6), and forming a hole injecting layer by pulverizing molybdenum trioxide to form fine particles and dispersing them in a solution to form a slurry, which is then coated (Patent document 7).

In addition, for organic luminescent devices other than organic EL elements, such as light-emitting electrochemical cells (LECs) and electrochemiluminescence (ECL) (for example, Non-patent document 1), as well as for organic electronic devices such as organic transistors or organic solar cells, wherein a known strategy is to increase the carrier density in the organic transistor layer near the electrode by introducing a charge-transfer complex into the organic transistor, as an attempt to improve the on-state current value in the organic transistor and stabilize the element characteristics by lowering the charge injecting barrier between the organic transistor layer and the source electrode or drain electrode in the organic transistor (Patent document 8, for example), it is important for the charge injecting barrier between the electrode and organic layer to be lowered for high charge injection efficiency, while it is also important to allow convenient and efficient production by coating methods.

CITATION LIST

Patent Literature

[Patent document 1] Japanese Unexamined Patent Application Publication No. 2005-44615
[Patent document 2] Japanese Unexamined Patent Application Publication No. 2006-155978
[Patent document 3] Japanese Unexamined Patent Application Publication No. 2007-287586
[Patent document 4] Japanese Patent Publication No. 2824411
[Patent document 5] Japanese Patent Publication No. 3748110
[Patent document 6] Japanese Unexamined Patent Application Publication No. 2007-180526
[Patent document 7] Japanese Unexamined Patent Application Publication No. 2008-41894
[Patent document 8] Japanese Unexamined Patent Application Publication No. 2002-204012

Non-Patent Literature

[Non-patent document 1] "Synthetic Metals", (1997), vol. 85, p. 1229-1232

SUMMARY OF THE INVENTION

Technical Problem

The organic electronic device of the invention provides an organic electronic device comprising two or more electrodes facing each other on a substrate, and an organic functional layer that includes a hole injecting layer situated between two electrodes, wherein the hole injecting layer is a layer comprising metal oxide clusters that include at least one metal element selected from among elements of Group 5, Group 6 or Groups 8-10 of the Periodic Table, the metal oxide clusters being polyoxometalates, as well as a method for producing the same.

The development of organic electronic devices includes advances aimed at allowing production of organic electronic devices with long usable life by improving the hole injecting properties and hole transport efficiency of the hole injecting layer or hole transporting layer, by employing coating methods that allow inexpensive formation as methods for producing element structures, and also aimed at increasing the driving life of the organic electronic device by forming smooth, adhesive coating films.

However, in the case of PEDOT/PSS which has a low concentration of anions such as sulfate ion, or cations, developed in the examples of Patent document 1, the durability of the PEDOT/PSS has been low and the lifetime characteristic been insufficient. In addition, the anions such as sulfate ion and the cations have been considered impurities in need of removal. When a hole injecting layer is formed with a metal oxide as disclosed in Patent documents 2-6, the hole injection properties are improved but the driving stability of oxygen defects in the oxide is reduced, presumably having an adverse effect on the lifetime characteristic.

Although an organic electronic device such as an organic EL element with a relatively long lifetime can be fabricated by applying a metal oxide vapor deposition film to the hole injecting layer in this manner, the lifetime characteristic has been insufficient and further improvement has been necessary.

The oxidizing materials disclosed in Patent documents 2-8 have been problematic in that they are poorly soluble or insoluble in water or organic solvents, the desired film thickness cannot be guaranteed for film formation by coating methods, and stable formation cannot be achieved. When an ink comprising a mixture of such an oxidizing material and a hole transporting material is used for film formation by a coating method, aggregation tends to occur with the oxidizing material alone, and since the usable solvent types are also limited, the flexibility of use is impaired.

Patent document 7 mentions that approximately 20 nm molybdenum fine particles are produced and applied to a hole injecting layer by a coating method, but when a method involves pulverizing MoO$_3$ powder, it is difficult in practice to create fine particles with a uniform size on the scale of up to 10 nm lengths, for example, and it is even more difficult to stably disperse fine particles in solution without aggregation. If solubilization of the fine particles is unstable, the coated film formation only results in a poorly smooth film with large irregularities, and this leads to shorting of the device.

When MoO$_3$ is used as the hole transporting material it is possible to obtain relatively high properties, but it is insoluble in solvents and does not permit the use of coating methods. Even if the luminescent layer is separately coated by a coating method such as an ink-jet method, the advantages of using a coating method are ultimately forfeited if the thin-film formation can only be accomplished by a vapor deposition method. Specifically, the hole injecting layer or hole transporting layer containing MoO$_3$ must be vapor deposited using a high definition mask in order to avoid impairing the liquid repellency of the barrier (bank) between each luminescent layer by the lyophilic MoO$_3$, and as a result it has not been possible to utilize coating methods from the viewpoint of cost and yield.

In addition, compounds that easily permit thermal vapor deposition for MoO$_3$ are limited to compounds having stable valencies, such as MoO$_3$ or MoO$_2$, and which are oxides. Such MoO$_3$ compounds can only be used in vacuum processes, particularly utilizing the volatility of MoO$_3$, and therefore their range of applicability is limited. Molybdenum oxides or molybdenum metal which have low valencies generally oxidize readily in air and are difficult to handle, for which reason they are almost never used as structural materials in organic electronic devices.

Methods for producing such organic electronic device element structures are limited to vapor deposition methods due to the insolubility of $MoO_3$ in water or solvents, but because vapor deposition methods require shadow masks and are costly, methods allowing more economical formation, such as coating methods, have been desired.

As mentioned above, it is currently difficult to achieve elements with long usable life, even when using oxidizing materials such as those disclosed in Patent documents 1-8 as the hole injecting/transporting materials, and there is a need for increased lifetime.

The film formability and thin-film stability are closely related to the element lifetime characteristic. The lifetime of an organic EL element is generally considered to be the time to half-brightness with continuous driving such as constant current driving, and a longer time to half-brightness corresponds to a longer element lifetime.

The present invention has been accomplished in light of the problems described above, and its object is to provide a material that is excellent as a hole injecting/transporting material for formation of hole injecting layers and/or hole transporting layers non-existent in the prior art, as well as an organic electronic device wherein the hole injecting layer and/or hole transporting layer can be formed by a coating method, and that has an easy production process while allowing a long lifetime to be achieved.

Solution to Problem

As a result of much diligent research directed toward accomplishing this object, the present inventors have found that the driving lifetime can be increased by using metal oxide clusters of molybdenum or the like in the hole injecting layer and/or hole transporting layer, although the principle therefor has not been precisely elucidated.

Since the metal oxide cluster of molybdenum or the like is a giant cluster molecule comprising a chemically synthesized polyoxometalate, its size and weight will be determined by the molecular weight, and the size and shape of each cluster is the same. In addition, the electrical properties are anionic and equivalent in each cluster. For example, in the case of a $Na_1[Mo^{VI}{}_{126}Mo^{V}{}_{28}O_{462}H_{14}(H_2O)_{70}]_{0.5}[Mo^{VI}{}_{124}Mo^{V}{}_{28}O_{457}H_{14}(H_2O)_{68}]_{0.5} \cdot 400H_2O$ cluster (Mo154) used in the examples described herein, the molecules have donut shapes and the number-mean particle size is approximately 4 nm. The molybdenum oxide cluster is a mixed valence polyoxometalate with each molecule accommodating both hexavalent ($Mo^{VI}$) and pentavalent molybdenum ($Mo^V$) forms.

Generally, molybdenum oxide is an oxygen deficiency-type oxide semiconductor, and in terms of electrical conductivity, the pentavalent $Mo_2O_5$ and tetravalent $MoO_4$ are better conductors at ordinary temperature than the hexavalent $MoO_3$. For use as a hole injecting layer in an element, it is believed that the hole transport property and hole injection property are appropriately controlled by the balance between pentavalent and hexavalent forms to realize low-voltage driving, and because the oxidation-reduction property is stable, a long lifetime characteristic is realized.

However, hexavalent molybdenum is a more stable valency than the tetravalent or pentavalent forms, and presumably when the unstable pentavalent form is converted to hexavalent, disrupting the balance, the hole transport property or hole injection property of the organic electronic device is altered, thereby resulting in deterioration in the driving stability and adversely affecting the lifetime characteristic.

Thus, in order to obtain a long lifetime it is necessary for atoms of different valencies, pentavalent and hexavalent, to be stably coexistent, and with the expectation that metal elements that can stably exist with different valencies are basically superior as hole injecting materials, attention was directed toward metal oxides having such metal elements with different atomic valencies coexistent, with particular focus on anionic metal oxide clusters containing molybdenum, and specifically molybdenum oxide clusters in which it is believed that such different valencies, i.e. pentavalent and hexavalent forms, can stably exist in a fixed proportion, and it was found that application thereof to at least the hole injecting layer can increase driving lifetime.

By chemical synthesis it is relatively easy to form such metal oxide clusters in which metal elements with different valency states are stably coexistent.

A polyoxometalate which is a metal oxide cluster in which such different valency states are coexistent will be referred to as "mixed valence polyoxometalate". The term "mixed valence" means a state in which identical metal elements having different atomic valencies are coexistent, a state in which different metal elements of the same group with different atomic valencies are coexistent, or a state in which different metal elements with different atomic valencies are coexistent. For example, the molybdenum oxide cluster mentioned above is an oxide in which different valencies, pentavalent and hexavalent, are coexistent, and it may be considered a mixed valence polyoxometalate. Since a metal oxide cluster is a macromolecule on the nanometer order and is chemically synthesized, it forms fine particles with a uniform primary particle size of no greater than 10 nm, with identical compositions among the fine particles.

Thus, even if the cluster molecules aggregate during driving, they are aggregates of equivalent molecules and therefore, it is conjectured, the composition and the electrical characteristics such as valency distribution are spatially uniform on a scale of lengths of several tens of nm, which is longer than the sizes of the molecules, while variation in the conductivity or hole injection property is reduced and driving can be achieved with a longer lifetime. In addition, since the metal oxide cluster readily dissolves in solvents and can stably exist in a dissolved state, it is easy to use coating to form a film composed of a smooth hole injecting layer and/or hole transporting layer.

It was found that the metal oxide cluster may be used in a hole injecting layer and/or hole transporting layer to allow formation of the hole injecting layer and/or hole transporting layer by a coating method, thereby facilitating the production process, while allowing improvement in the hole injection property over common molybdenum oxides such as $MoO_3$, as a charge transport property material, and allowing formation of a highly stable hole injecting layer and/or hole transporting layer that also has excellent adhesiveness with adjacent electrodes or organic functional layers, and the invention has been completed upon this finding.

The metal oxide cluster used in an organic electronic device of the invention is an anion and can therefore stably disperse in aqueous solution. Furthermore, because it is an anion, an organic material can be coordinated with it by a cation exchange method or the like, to allow easy dispersion in organic solvents. On the other hand, fine particles produced by physically pulverizing ordinary $MoO_3$ are electrically neutral, and it has been exceedingly difficult to accomplish stable dispersion in solutions and highly reproducible film formation. Therefore, using the metal oxide cluster of the invention in an organic electronic device is highly advantageous for the production process because it allows stable thin-film formation.

In addition, formation is possible by a simple successive coating process, from hole injecting layer and/or hole transporting layer to luminescent layer, on a substrate with a liquid-repellent bank. This consequently affords the advantage of permitting fabrication of devices in a simpler manner and at lower cost compared to processes in which the hole injecting layer is vapor deposited by high-definition mask vapor deposition and then the hole transporting layer or luminescent layer is formed by a coating method, after which the second electrode is vapor deposited, as in the case of molybdenum trioxide ($MoO_3$).

The hole injecting layer and/or hole transporting layer used in the organic electronic device of the invention combines metal oxide clusters in which metal elements with different valency states are stably coexistent, with an organic compound that functions as a hole-transporting material and as an organic binder, unlike layers using common metal oxide particles, and it is thus possible to improve the coating film formability, film quality, film strength and flexibility compared to using metal oxide particles alone, while the interfacial adhesiveness with adjacent organic functional layers is satisfactory, electrical charge mobility can be maintained and adhesiveness between organic electronic device layers increased, such that an organic electronic device of the invention comprising a hole injecting layer and/or hole transporting layer containing the metal oxide clusters allows a device with low-voltage driving, high power efficiency and a long lifetime to be realized.

In the organic electronic device of the invention, if the hole-transporting material that is used together with the metal oxide clusters is an aromatic amine-based compound according to the invention, for example, selection of the type of functional groups in the molecule or modification of the functional groups, to impart functions such as hydrophilicity/hydrophobicity, a charge transport property or adhesiveness for multifunctionality, can produce a hole-transporting material suited for the physical properties of the metal oxide clusters, thus allowing formation of a hole injecting layer and/or hole transporting layer having excellent functions.

The hole injecting layer and/or hole transporting layer in the organic electronic device of the invention preferably comprises the metal oxide clusters and hole-transporting material from the viewpoint of lowering the driving voltage and stabilizing the element lifetime.

The hole injecting layer and/or hole transporting layer in the organic electronic device of the invention may also be a laminated layer comprising at least a layer that contains the metal oxide clusters and a layer that contains the hole-transporting material.

For the organic electronic device of the invention, it may also be a laminated layer comprising at least a layer that contains the metal oxide clusters and a layer that contains at least the metal oxide clusters and the hole-transporting material.

The organic electronic device of the invention preferably comprises metal oxide clusters and an aromatic amine-based compound, from the viewpoint of stabilizing the film formability.

Molybdenum oxide clusters as metal oxide clusters in the organic electronic device of the invention are preferably chemically synthesized giant cluster molecules from the viewpoint of lowering the driving voltage and further increasing the element lifetime.

The metal oxide clusters in the organic electronic device of the invention are preferably chemically synthesized molybdenum oxide clusters that dissolve in aqueous media and the aromatic amine-based compound of the hole-transporting material is preferably compatible with aqueous solvents by introduction of hydroxyl groups into the molecule, from the viewpoint of stabilizing the film formability of the metal oxide clusters.

Forming the hole injecting layer and/or hole transporting layer in the organic electronic device of the invention by a coating method is preferred for facilitating the production process, minimizing shorts, increasing yield and achieving a long device lifetime, since it is possible to form the hole injecting layer and/or hole transporting layer that maintains the state of metal oxide clusters in which metal elements with different valencies can stably coexist, as the hole injecting/transporting material.

In the organic electronic device of the invention, the organic functional layer may be one that has been formed by a coating method on the hole injecting layer and/or hole transporting layer. The hole injecting layer and/or hole transporting layer of the invention will occasionally be insoluble in the solvent used for the solution, after it has been formed by a coating method, in which case the organic functional layer may be laminated by a coating method.

The organic electronic device of the invention may be suitably used as an organic EL element, in which the organic functional layer comprises at least a luminescent layer.

The method for producing an organic electronic device according to the invention is a method for producing an organic electronic device comprising two or more electrodes facing each other on a substrate, and an organic functional layer that includes at least a hole injecting layer situated between two electrodes, the method comprising a step of forming a hole injecting layer comprising metal oxide clusters that include at least one metal element selected from among elements of Group 5, Group 6 or Groups 8-10 of the Periodic Table, the metal oxide clusters being chemically synthesized polyoxometalates, the step of forming the hole injecting layer including a step of laminar formation of a uniformly dissolved or uniformly dispersed or mixed fluid material comprising the metal oxide clusters, so that the production process is facilitated and an organic electronic device capable of exhibiting a long lifetime is provided.

According to the method for producing an organic electronic device of the invention, it is possible to allow formation of a hole injecting layer and/or hole transporting layer comprising metal oxide clusters on any layer on an electrode by a coating method, and to facilitate the production process, while providing an organic electronic device that can exhibit a long lifetime.

Specifically, the organic electronic device of the invention relates to an organic electronic device comprising two or more electrodes facing each other on a substrate, and an organic functional layer that includes a hole injecting layer and/or a hole transporting layer situated between two electrodes, wherein the hole injecting layer and/or hole transporting layer is a layer comprising metal oxide clusters that include at least one metal element selected from among elements of Group 5, Group 6 or Groups 8-10 of the Periodic Table, the metal oxide clusters being chemically synthesized polyoxometalates, as well as a method for producing the same.

For other organic devices, as well, such as dye-sensitized solar cells, organic thin-film solar cells and organic semiconductors or quantum dot light emitting elements, oxide-based compound solar cells and the like having hole injecting transporting layers, if a hole injecting transport layer of the invention is used as the hole injecting layer and/or hole transporting layer, the rest of the structure may be the same as known structures, without any particular restrictions.

Advantageous Effects of Invention

The organic electronic device of the invention, comprising a hole injecting layer and/or hole transporting layer containing metal oxide clusters that include at least one metal element selected from among elements of Group 5, Group 6 or Groups 8-10 of the Periodic Table, wherein the metal oxide clusters are chemically synthesized polyoxometalates, allows devices with low-voltage driving, high power efficiency and long lifetime to be realized.

In the organic electronic device of the invention, by using metal oxide clusters having not only a single valency state which is the valency of the metal element that is generally considered stable, but also having stable coexistence of metal elements with different valency states that are considered unstable, and adding an organic compound with a hole injection/transport property to the metal oxide clusters, it is possible to improve the hydrophilicity/hydrophobicity, the hole transport property or the coating film formability, film quality, film strength and flexibility, and to impart functionality such as adhesiveness, thus facilitating multifunctional modification of the hole injecting layer and/or hole transporting layer and increasing the function of the element.

In the organic electronic device of the invention, it is preferred to use not only metal oxide clusters composing the hole injecting layer alone, but also a hole-transporting material in which an organic compound with a hole transport property is able to stably dissolve, disperse or mix with the metal oxide clusters, in order to allow easy formation of a smooth hole injecting layer, and this can further reduce the driving voltage or improve the driving lifetime of the element.

It is also preferred because the hole injecting material and/or hole transporting material in the organic electronic device of the invention can easily adopt a stable fluid material state, so that it is possible to form the hole injecting layer and/or hole transporting layer by a coating method and facilitate the production process, while also minimizing shorts and allowing production yield to be increased and a long lifetime to be achieved.

In the organic electronic device of the invention, the organic functional layer may be one that has been formed by a coating method on the hole injecting layer and/or hole transporting layer. The hole injecting layer and/or hole transporting layer of the invention will occasionally be insoluble in the solvent used for the solution, after it has been formed by a coating method, in which case the organic functional layer may be laminated by a coating method.

As mentioned above, the organic electronic device of the invention contains metal oxide clusters in the hole injecting layer and/or hole transporting layer, thereby improving the hole injection property, and yielding a film with excellent adhesiveness with adjacent electrodes and organic functional layers and high stability, such that a long element driving lifetime can be achieved. Furthermore, the organic electronic device of the invention differs from those using the inorganic compound molybdenum trioxide ($MoO_3$), in that the metal oxide clusters uniformly dissolve in solvents, or form uniform dispersions or mixtures, thus allowing a uniform fluid material to be formed, and since thin-film formation can therefore be accomplished by a coating method, the production process is facilitated.

The organic electronic device of the invention can exhibit a long lifetime while having a facilitated production process. According to the method for producing an organic electronic device of the invention, it is possible to employ a production process that uses a coating method, so that it is possible to provide a production process which allows easy production of organic electronic devices with long lifetimes.

DESCRIPTION OF EMBODIMENTS

Figure 1:
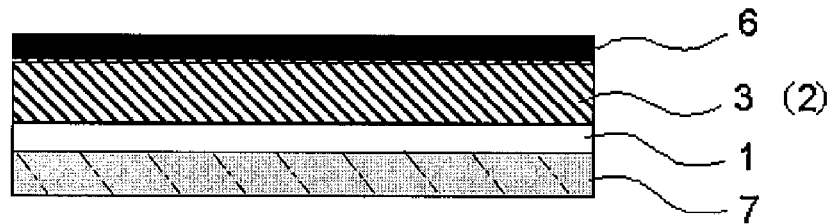
FIG. 1 is a cross-sectional conceptual drawing showing the basic laminar structure of an organic electronic device according to the invention.

The invention will now be explained in further detail with reference to the accompanying drawings.

First, an organic electronic device according to the invention will be explained using FIG. 1, a drawing showing a first example of the laminar structure, as a conceptual cross-sectional view of an organic electronic device of the invention.

1. Organic Electronic Device

The organic electronic device of the invention is an organic electronic device comprising two or more electrodes facing each other on a substrate, and an organic functional layer that includes at least a hole injecting layer and/or a hole transporting layer situated between two electrodes, wherein the hole injecting layer and/or hole transporting layer is a layer comprising anionic metal oxide clusters that include at least one metal element selected from among elements of Group 5, Group 6 or Groups 8-10 of the Periodic Table, the metal oxide clusters being chemically synthesized polyoxometalates.

In the organic electronic device of the invention, the hole injecting layer and/or hole transporting layer comprises metal oxide clusters that include at least one metal element selected from among elements of Group 5, Group 6 or Groups 8-10 of the Periodic Table, which are metal oxide clusters, i.e., polyoxometalate giant cluster molecules, and it is believed that the conducting mechanism of hole transport or hole injection with the metal oxide clusters is the same as with common hole transport materials or hole injecting materials in organic EL elements, with the atoms of each cluster undergoing repeated oxidation-reduction which drives injection or transport of electrical charge.

When used as a hole injecting layer in an element, the hole injection property or hole transport property is appropriately controlled by the balance of mixed valence (for example, pentavalent and hexavalent in the case of molybdenum), as a coexistent state of metal elements with different valencies, allowing low-voltage driving to be realized, and improving the hole injection property as a result of stabilized oxidation-reduction characteristics, while the resulting film has excellent adhesiveness with adjacent electrodes or organic functional layers and exhibits high stability, so that an element with a long lifetime can be obtained.

Since the organic electronic device of the invention comprises metal oxide clusters which are chemically synthesized polyoxometalates, it has uniform dissolving or dispersing properties in solvents and thus allows formation of thin-films by coating methods, thereby facilitating the production process.

Moreover, by selecting an aromatic amine-based organic compound, for example, to be used with the metal oxide clusters or chemically modifying the organic compound, such as an aromatic amine-based compound, in the organic electronic device of the invention, it is possible to impart multi-functionality, including functions of hydrophilicity/hydrophobicity, charge transport property or adhesiveness to the aromatic amine-based compound, thereby improving uniform solubility and uniform dispersibility or miscibility to allow application as a uniform fluid material, and facilitating formation of a film with an excellent hole injection property and high stability.

It is believed that the metal oxide clusters used in the organic electronic device of the invention are able to increase the lifetime because the metal oxide clusters are metal oxide clusters that include at least one metal element selected from among elements of Group 5, Group 6 or Groups 8-10 of the Periodic Table, and that are chemically synthesized polyoxometalates, forming an atomic configuration that allows metal elements with different valency states to stably coexist, thereby limiting alteration of the hole injection property or hole transport property by driving stress, and that it is easier to form a state of easy electrical charge mobility with the hole-transporting material or between the metal oxide clusters.

The polyoxometalate metal oxide clusters of the invention differ from simple metal oxide particles of inorganic compounds in that they consist of aggregated states of chemically synthesized nanoparticles, permitting uniform compatibility with the organic hole-transporting material, permitting formation of a smooth coating film and resulting in satisfactory adhesiveness at the interfaces with adjacent organic functional layers. Consequently, an organic electronic device of the invention comprising a hole injecting layer and/or hole transporting layer that includes the metal oxide clusters is capable of low-voltage driving, and allows devices with high power efficiency and especially increased driving lifetime to be realized.

Since the hole injecting layer and/or hole transporting layer can be formed by a coating method for the organic electronic device of the invention, it is possible to accomplish formation from the hole injecting layer and/or hole transporting layer to the luminescent layer on a substrate with a liquid-repellent bank, using only successive coating processes. This affords the advantage of permitting fabrication of organic electronic devices in a simpler manner and at lower cost compared to processes in which the hole injecting layer is vapor deposited by high-definition mask vapor deposition, and then the hole transporting layer or luminescent layer is formed by a coating method, after which the second electrode is vapor deposited, as in the case of molybdenum trioxide ($MoO_3$) which is used to form layers by vapor deposition methods.

A laminar structure for an organic electronic device of the invention will now be described. For the examples of the invention, a laminar structure designed to improve the carrier balance was employed, with a hole block layer (hole blocking layer) provided on the cathode side of the luminescent layer to produce carrier recombination in the luminescent layer, but the hole block layer is not shown in the drawing.

FIG. 1 is a cross-sectional conceptual drawing showing the basic laminar structure of an organic electronic device according to the invention. The basic laminar structure of the organic electronic device of the invention comprises two opposing electrodes (1 and 6) on a substrate 7, and an organic functional layer 3 including at least a hole injecting layer 2 (or 2b) and/or a hole transporting layer (4a, 4b) situated between the two electrodes (1 and 6).

The substrate 7 is a support for formation of each layer that is to compose the organic electronic device, and it does not necessarily need to be provided on the surface of the electrode 1, but may instead be provided on the outermost side of the organic electronic device.

The hole injecting layer 2 and/or hole transporting layer comprises at least chemically synthesized metal oxide clusters, and the layers perform the roles of injection and/or transport of holes from the electrode 1 to the organic functional layer 3.

By injection and transport of holes to the organic functional layer 3, the layer exhibits various functions depending on the type of device, and depending on the case it may be composed of a monolayer or multilayers. When the organic functional layer is composed of multilayers, the organic functional layer further comprises a layer serving the core function of the organic electronic device (hereunder, "functional layer") or a layer auxiliary to the functional layer (hereunder, "auxiliary layer"), in addition to the hole injecting layer and/or hole transporting layer. In the case of an organic EL element, for example, the hole transporting layer further laminated on the surface of the hole injecting layer and/or hole transporting layer corresponds to an auxiliary layer, and the luminescent layer laminated on the surface of the hole transporting layer corresponds to the functional layer.

An electrode 6 is provided at a location such that the organic functional layer 3 comprising the hole injecting layer 2 and/or hole transporting layer is present between it and the opposing electrode 1. If necessary, it may also have a third electrode (not shown). The function of the organic electronic device can be exhibited by applying an electric field between the electrodes.

Figure 2:
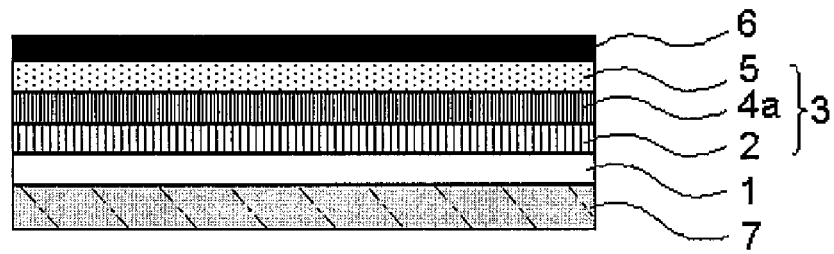
FIG. 2 is a cross-sectional schematic drawing showing another example of a laminar structure in an organic EL element as an embodiment of an organic electronic device according to the invention, wherein the hole injecting layer 2 is formed of a layer comprising metal oxide clusters.

FIG. 2 is a cross-sectional schematic drawing showing an example of a laminar structure in an organic EL element, as one embodiment of an organic electronic device according to the invention.

The organic EL element of the invention has a form with a hole injecting layer 2 laminated on the surface of an electrode 1, and a hole transporting layer 4a as an auxiliary layer and a luminescent layer 5 as the functional layer, laminated on the surface of the hole injecting layer 2. Thus, when the characteristic metal oxide clusters of the invention are used in the location of the hole injecting layer, the electric conductivity is improved while a coating method can be used for lamination of the hole injecting layer. Increased adhesiveness with the electrodes may also be expected.

Figure 3:
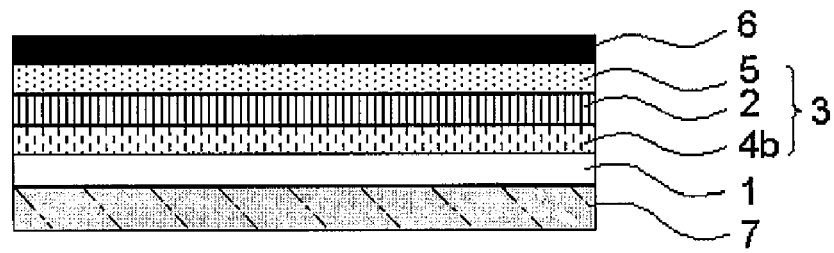
FIG. 3 is a cross-sectional schematic drawing showing an example of a laminar structure in an organic EL element as an embodiment of an organic electronic device according to the invention, wherein the hole injecting layer 2 is formed of a layer comprising metal oxide clusters and an aromatic amine-based compound.

FIG. 3 is a cross-sectional schematic drawing showing a different example of a laminar structure in an organic EL element, as one embodiment of an organic electronic device according to the invention.

The organic EL element of the invention has a hole injecting layer 2 comprising metal oxide clusters of the invention formed on the surface of an electrode 1, with a hole transporting layer composed of bis (N-(1-naphthyl-N-phenyl)benzidine) formed on the surface of the hole injecting layer 2 comprising the metal oxide clusters of the invention, and then a hole transporting layer 4b comprising metal oxide clusters of the invention and a luminescent layer 5 as the functional layer are further laminated. When the characteristic metal oxide clusters of the invention are used in the locations of the hole injecting layer and hole transporting layer in this manner, it is possible to increase the electric conductivity while not only allowing formation of the hole injecting layer and hole transporting layer by coating methods, but also allowing a coating method to be applied for lamination of the upper luminescent layer as well.

Figure 4:
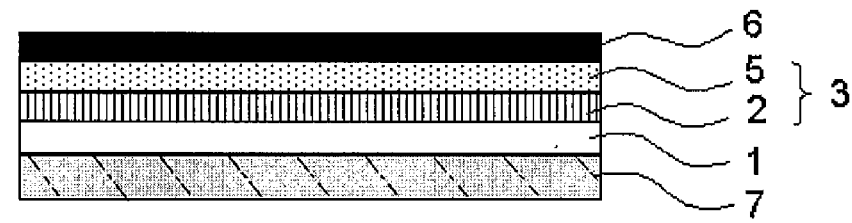
FIG. 4 is a cross-sectional schematic drawing showing another example of a laminar structure in an organic EL element as an embodiment of an organic electronic device according to the invention, wherein the hole injecting layer 2 and the hole transporting layer 4b are formed of layers comprising metal oxide clusters and an aromatic amine-based compound.

FIG. 4 is a cross-sectional schematic drawing showing a different example of a laminar structure in an organic EL element, as one embodiment of an organic electronic device according to the invention. The organic EL element of the invention has a form in which a hole injecting layer 2 comprising metal oxide clusters of the invention and a luminescent layer 5 as the functional layer are laminated in that order on the surface of an electrode 1. Using a single characteristic hole injecting layer of the invention as in this case has the advantage of reducing the number of steps in the process.

In FIGS. 2 to 4, the hole injecting layer 2 comprising metal oxide clusters of the invention, the hole transporting layer 4a, and the hole transporting layer 4b comprising metal oxide clusters of the invention may each be composed of either monolayers or multilayers.

Also, in FIGS. 2 to 4, the electrode 1 functions as the anode and the electrode 6 functions as the cathode. The organic EL element described above has a function whereby, when an electric field is applied between the anode and cathode, holes are injected from the anode into the luminescent layer 5 through the hole injecting layer 2 and/or hole transporting layer 4a•4b, which comprise metal oxide clusters of the invention, while electrons are injected from the cathode into the luminescent layer, thereby resulting in recombination between the holes and electrons injected into the luminescent layer 5, and producing luminescence toward the exterior of the element.

In order to irradiate light outward from the element, all of the layers on at least one side of the luminescent layer must have transparency to light of at least part of the visible wavelength range. An electron transporting layer and/or electron injecting layer (not shown) may also be provided, if necessary, between the luminescent layer and the electrode 6 (cathode).

Figure 5:
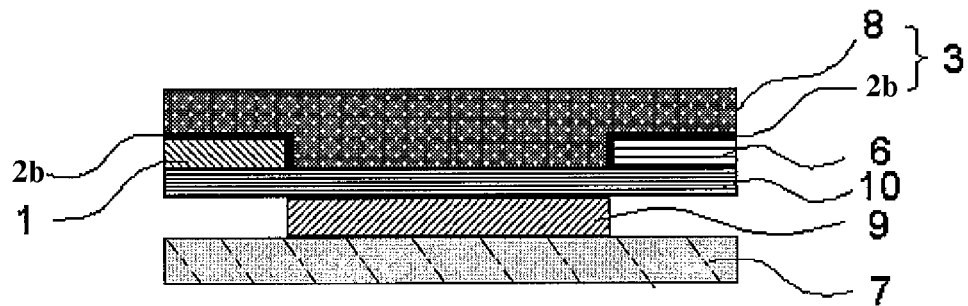
FIG. 5 is a cross-sectional schematic drawing showing an example of a laminar structure in an organic transistor, as a different embodiment of an organic electronic device according to the invention.

FIG. 5 is a cross-sectional schematic drawing showing an example of a laminar structure in an organic transistor, as a different embodiment of an organic electronic device according to the invention.

This organic transistor comprises an electrode 9 (gate electrode), an electrode 1 (source electrode) and electrode 6 (drain electrode) which are opposing, an organic transistor layer 8 as an organic functional layer situated between the electrode 9, the electrode 1 and the electrode 6, and an insulating layer 10 lying between the electrode 9 and electrode 1 and between the electrode 9 and electrode 6, on a substrate 7, with a hole injecting transporting layer 2b comprising metal oxide clusters of the invention formed on the surfaces of the electrode 1 and electrode 6.

The organic transistor has the function of controlling current between the source electrode-drain electrode by controlling accumulation of electrical charge in the gate electrode.

Figure 6:
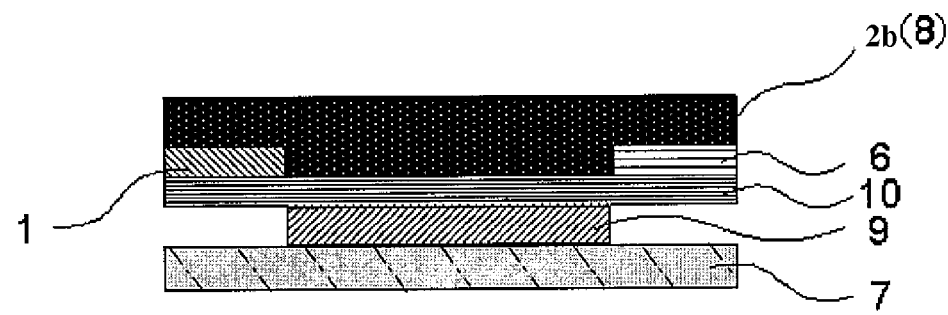
FIG. 6 is a cross-sectional schematic drawing showing another example of a laminar structure in an organic transistor, as a different embodiment of an organic electronic device according to the invention.
Figure 7:
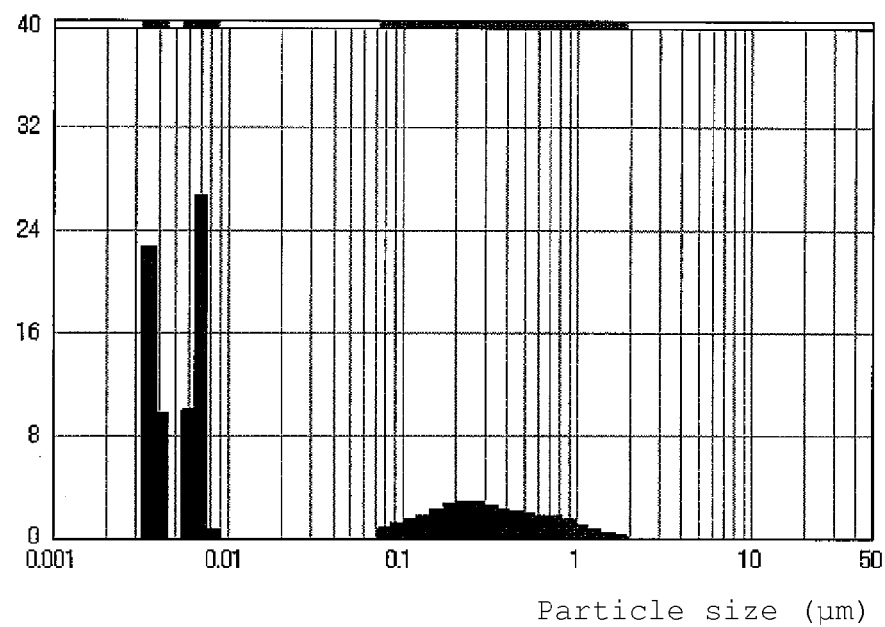
FIG. 7 is a graph showing the results of measuring the particle sizes of molybdenum oxide clusters used in an organic electronic device of the invention.

FIG. 6 is a cross-sectional schematic drawing showing an example of a laminar structure in an organic transistor, as a different embodiment of an organic electronic device according to the invention.

This organic transistor comprises an electrode 9 (gate electrode), an electrode 1 (source electrode) and electrode 6 (drain electrode) which are opposing, an organic transistor layer 8, which is formed of a hole injecting transporting layer 2b comprising metal oxide clusters of the invention as an organic functional layer situated between the electrode 9, the electrode 1 and the electrode 6, and an insulating layer 10 lying between the electrode 9 and electrode 1 and between the electrode 9 and electrode 6, on a substrate 7. In this example, the hole injecting transporting layer 2b serves as the organic transistor layer 8.

The laminar structure of the organic electronic device of the invention is not limited to these examples, and any mode that has a construction essentially identical in terms of the technical concept described in the claims of the present invention and exhibits the same function and effect is also encompassed by the technical scope of the invention.

Each layer of the organic electronic device of the invention will now be described in detail.

(1) Hole Injecting Layer and/or Hole Transporting Layer, and Organic Functional Layer The organic functional layer in the organic electronic device of the invention comprises at least a hole injecting layer and/or a hole transporting layer, or as mentioned above, when the organic functional layer is composed of a multilayer, the organic functional layer includes a layer serving the core function of the organic electronic device and an auxiliary layer that performs the role of aiding the functional layer, in addition to the hole injecting layer and/or hole transporting layer; the functional layer and auxiliary layer will now be explained in detail for working examples of the organic electronic device.

The hole injecting layer and/or hole transporting layer in the organic electronic device of the invention comprises at least metal oxide clusters. The hole injecting layer and/or hole transporting layer in the organic electronic device of the invention may consist entirely of metal oxide clusters, or it may further contain other components. It preferably further contains a hole transporting material from the viewpoint of lowering the driving voltage and further extending the element lifetime.

When it further contains a hole transporting material, the hole injecting layer and/or hole transporting layer in the organic electronic device of the invention may be composed of one layer comprising the metal oxide clusters and hole transporting material, or it may be composed of a plurality of layers including said layer comprising the metal oxide clusters and hole transporting material. Also, the hole injecting layer and/or hole transporting layer may consist of a plurality of layers in which there are laminated at least a layer that contains the metal oxide clusters and a layer that contains the hole transporting material. In addition, the hole injecting layer and/or hole transporting layer may comprise a layer in which there are laminated at least a layer that contains the metal oxide clusters and a layer that contains at least the metal oxide clusters and the hole transporting material.

(Hole Injecting/Transporting Material)

The metal oxide clusters used for the invention are metal oxide clusters containing at least one metal element selected from among Group 5, Group 6 or Groups 8-10 of the Periodic Table, which are polyoxometalate (POM) anionic metal oxide clusters, each of the individual clusters being chemically synthesized giant cluster molecules.

Metal oxide clusters usually contain fine nano-order size particles of a metal oxide. Nanoparticles are particles having diameters on the nm (nanometer) order, i.e. less than 1 μm.

POM is a polyacid structure comprising an oxoacid. Polyoxometalates can generally be represented by the following formula.

$$[X_xM_yO_z]^{n-}$$

In the formula, x=0 corresponds to an isopolyacid, and x=1, 2, 3, ... corresponds to a heteropolyacid. X is primarily either at least one type of element selected from among Groups 13-15 or at least one type of element selected from among cobalt and rare earths, and M is primarily at least one type of element selected from among Groups 5-11 (y=1, 2, 3, ...), also including lanthanoids and actinoids. For example, M may be Mo, W, Cr, V, Nb, Fe, Ta, Al or the like and X may be P, As, Si, B, Co, Al or the like, with X and M being selected mainly from these metal elements. For polyoxometalates, n is said to be a natural number.

Specific examples of isopolyacids include $[Mo_6O_{19}]^{2-}$, $[MO_{10}O_{32}]^{4-}$, and as heteropolyacids, $[PMo_{12}O_{40}]^{3-}$, $[BW_{12}O_{40}]^{5-}$, $[SbW_6O_{24}]^{8-}$, $[SiV_2W_{10}O_{40}]^{6-}$, $[V_{18}O_{44}N_3]^{n-}$, $[PW_nMO_mO_{40}]^{3-}$ (n+m=12, n, m are 0, 1, 2, 3 ...), $[SiW_nMo_mO_{40}]^{4-}$ (n+m=12, n, m=0, 1, 2, 3 ..., $[PV_nW_mO_{40}]^{r-}$ (n+m=1, n=1, 2, 3, 4, r−n=3) and $[PV_nMo_mO_{40}]^{r-}$ (n+m=12, n=1, 2, 3, 4, r−n=3). In contrast to ordinary molybdenum oxides such as $MoO_3$ which have the compositional formula $Mo^{VI}_nO_{3n}$, polyacids such as $[Mo^{VI}_6O_{19}]^{2-}$ contain a large amount of oxygen even in the hexavalent state, similar to $Mo_nO_{3n+m}$ (m=1, 2, 3, ...), and contribute to the anionic state. These anionic clusters generally exist as hydrates with counter cations, and for example, $[BW_{12}O_{40}]^{5-}$ is known to exist as $K_5[BW_{12}O_{40}]\cdot 13H_2O$.

The structure of a POM metal oxide cluster may be a Keggin type, Dawson type or Anderson type. Because the transition metal ion M in POM can coordinate with 4-6 oxide ions, these cluster structures adopt polyhedral shapes that may be tetrahedral, square pyramidal or octahedral as the basic unit, with the structure being built up from these. Combinations of these atoms and structure results in a very large number of possible molecular structures, and α, β, γ and σ structural isomers also exist.

The metal oxide clusters can also easily have mixed valences due to reduction reaction of any POM. For example, $[PMo^{VI}_{12}O_{40}]^{3-}$ can be reduced to $[PMo^{VI}_{11}Mo^VO_{40}]^{3-}$ or $[PMo^{VI}_{10}Mo^V_2O_{40}]^{4-}$ while oxidizing a coexistent organic material or inorganic material, to result in a structure having different valences in the molecule. For example, it can be reduced by a donor guest molecule (a π electron compound, an organic molecule having an unsaturated bond such as a double bond or triple bond, or an amine, aromatic amine, pyridine derivative, ferrocene, hydroquinone or the like). The reduced anion has each electron stably reduced.

The metal oxide cluster that can be used for the invention is a polyoxometalate, and this includes the polyoxometalates represented by the general formula shown above, and preferably the polyoxometalates represented by the general formula shown above which are anionic metal oxide clusters. The material of the metal oxide clusters of the invention may be a POM that can be represented by the aforementioned general formula and that comprises the metal elements mentioned as examples.

Metal oxide cluster structures that may be used for the invention include Keggin, Dawson and Anderson type structures. The metal oxide cluster of the invention may also be a reduced mixed valence polyoxometalate, having a combination of such structures. Reduced anions characteristically have each electron stably reduced, and in the case of molybdenum, for example, molybdenum oxide clusters differ from ordinary molybdenum oxides such as $MoO_3$ by having pentavalent and hexavalent states coexist, thus allowing a mixed valence state to be obtained.

Examples of mixed valence polyoxometalates include $Na_{15}[Mo^{VI}_{126}Mo^V_{28}O_{462}H_{14}(H_2O)_{70}]_{0.5}[Mo^{VI}_{124}Mo^V_{28}O_{457}H_{14}(H_2O)_{68}]_{0.5}\cdot 400H_2O$, as a metal oxide cluster that may be used in the examples. Because the molecular structure is complex, the structure is commonly indicated by the convenient notation of $\{Mo_{154}\}$, representing the transition metal in the molecule. Other metal oxide clusters that may be suitably used for the invention are spherical $\{Mo_{132}\}$, ring-shaped $\{Mo_{142}\}$, $\{Mo_{154}\}$ and $\{Mo_{176}\}$, wheel-shaped $\{Mo_{248}\}$, and lemon-shaped $\{Mo_{368}\}$. In addition, $\{Mo_{57}V_6\}$ and $\{Mo_{57}Fe_6\}$ comprising different metal elements may also be used. These are synthesized by reduction of the aforementioned small Mo metal oxide clusters by chemical reaction and bonded by introduction of pentavalent and hexavalent Mo, and therefore they are structurally stable, while the incorporated pentavalent Mo also stably coexists. Because a stabilized anionic state can be maintained with stable coexistence of different valencies, it is possible to form a hole injecting layer with an excellent lifetime characteristic. On the other hand, ordinary molybdenum oxide such as $MoO_3$ consists almost entirely of $Mo^{VI}$, with a compositional formula of $Mo_nO_{3n}$. However, this is converted to $Mo_nO_{3n-m}$ due to oxygen deficiencies during vapor deposition of $MoO_3$ or during vapor deposition of pentavalent Mo on the layer of the slurry of pulverized $MoO_3$, or due to oxygen defects present on the particle surfaces produced by physical pulverization during slurry formation, and therefore some $Mo^V$ may be present. Nevertheless, because the $Mo^V$ introduced by $MoO_3$ is produced by oxygen defects, it is non-uniform and unstable.

Particularly preferred according to the invention are POMs that are metal oxide clusters comprising at least one metal element selected from among molybdenum (Mo), tungsten (W), vanadium (V) and iron (Fe).

Specific examples of metal oxide clusters to be suitably used for the invention include metal oxide clusters comprising at least one metal element selected from among molybdenum (Mo), tungsten (W), vanadium (V) and iron (Fe), that are low-molecular metal oxide clusters such as spherical $\{Mo_{132}\}$, ring-shaped $\{Mo_{142}\}$, $\{Mo_{154}\}$, $\{Mo_{176}\}$, wheel-shaped $\{MO_{248}\}$, lemon-shaped $\{Mo_{368}\}$ or $\{Mo_{11}\}$, $\{Mo_{12}\}$, $\{W_{10}\}$, $\{W_{12}\}$ or the like. There may also be used $\{Mo_{57}V_6\}$, $\{Mo_{57}Fe_6\}$, $\{PMo_{12}\}$, $\{SiMo_{12}\}$, $\{PVMo_{11}\}$, $\{PW_{12}\}$, $\{PV_2W_{10}\}$ and the like, comprising different atoms.

Most clusters, such as the metal oxide clusters to be used for the invention, may contain counter cations, such counter cations preferably being $H^+$, $Na^+$ or $K^+$, while cationic organic materials or ionic liquids may also be used.

Since the metal oxide clusters have greater compatibility with hole transporting materials and an improved charge transport property, the metal oxide clusters are preferably used together with a hole transporting material from the viewpoint of contributing to an extended lifetime. Furthermore, addition of a binder can improve the film formability, also allowing adjustment of ink viscosity.

Examples of hole transporting materials include aromatic amine derivatives, carbazole derivatives, thiophene derivatives, fluorene derivatives, distyrylbenzene derivatives and aniline derivatives, as explained below.

According to the invention, the metal oxide clusters uniformly dissolve in solvents or uniformly disperse and mix to allow formation of uniform fluid materials, and therefore the hole transporting material is preferably either selected so that, together with the metal oxide clusters, it stably and uniformly dissolves or uniformly disperses or mixes to form a fluid material, or is one that has been modified so as to form a uniform fluid material. For example, when the metal oxide clusters are molybdenum oxide clusters, which dissolve in aqueous solvents, the hole transporting material is most preferably also one that dissolves in aqueous solvents, and specifically there may be used N,N-bis-[4'-(hydroxy)[1,1'-biphenyl]-4-yl]-N-phenylamine, polyaniline or poly(3,4)ethylenedioxythiophene/polystyrene sulfonate (PEDOT/PSS, Baytron™ P AI4083, trade name of Starck, commercially available as an aqueous solution).

The content ratio of the metal oxide clusters and the hole transporting material used for the invention may be selected as appropriate and is not particularly restricted, but it is preferably 1-10,000 parts by weight of the hole transporting material with respect to 100 parts by weight of the metal oxide clusters.

The mean particle size of the metal oxide clusters of the invention is not particularly restricted and may be in the range of 0.5 nm-999 nm, for example, but it is preferably in the range of 0.5 nm-50 nm, more preferably in the range of 0.5 nm-20 nm and most preferably in the range of 1 nm-10 nm. If the mean particle size is too large, the surface area per unit weight (area-to-weight ratio) will be reduced, potentially making it impossible to obtain the desired device effect, while also affecting the surface roughness of the formed thin-film and risking a greater number of shorts.

Mean particle size is expressed by many notation methods, but the mean particle size of the macromolecular metal oxide clusters used for the invention was indicated using the number-mean particle size, because of aggregation, since the volume-mean or weight-mean notations are affected by the state of aggregation and can potentially undergo significant variation as a result.

The method for producing the metal oxide clusters to be used for the invention is not particularly restricted so long as it is a method allowing the metal oxide clusters described above to be obtained. Liquid phase methods may be mentioned as examples.

According to the invention, any hole transporting material may be used as appropriate together with the metal oxide clusters, so long as it is a compound with a hole transport property. The hole transport property referred to here is observation of overcurrent by hole transport, according to a known photocurrent method.

There are no particular restrictions on the hole transporting material, and examples of low molecular compounds include arylamine derivatives, anthracene derivatives, carbazole derivatives, thiophene derivatives, fluorene derivatives, distyrylbenzene derivatives and spiro compounds.

Examples of polymer compounds include polymers that contain arylamine derivatives, anthracene derivatives, carbazole derivatives, thiophene derivatives, fluorene derivatives, distyrylbenzene derivatives, aniline derivatives or spiro compounds as repeating units.

These hole transporting polymer compounds may be used alone, or two or more may be used in combination.

As hole transporting polymer compounds there are preferably selected materials that readily exhibit satisfactory adhesive stability with adjacent organic functional layers, and that have HOMO energy values between those of the anode substrate and luminescent layer material.

The hole transporting material of the invention may be either a low molecular compound or a polymer compound, but for the hole injecting layer and/or hole transporting layer of the invention, it is preferred to use a polythiophene-based compound, polyaniline-based or aromatic amine-based compound, which as hole transporting materials dissolve readily in organic solvents, water and aqueous solvents and do not easily form compound aggregates, thereby allowing stable coating film formation, so that a stable film can be formed by a coating method.

When a hole transporting material is used in the hole injecting layer and/or hole transporting layer of the invention, it is possible to improve the compatibility or adhesiveness between the metal oxide clusters and the hole transporting material that can be included in the same layer as the layer containing the metal oxide clusters, or in an adjacent layer, due to its affinity with the metal oxide clusters allowing its dissolution and uniform dispersion. This can increase the dispersion stability of the metal oxide clusters, and can prevent aggregation or phase separation between the metal oxide clusters during film formation or with prolonged driving of the luminescent device, thus allowing an electronic device with a long lifetime to be obtained.

When a hole transporting material is used in the hole injecting layer and/or hole transporting layer of the invention, the content of the hole transporting material is preferably 1-10,000 parts by weight with respect to 100 parts by weight of the metal oxide clusters, since this will increase the hole injection/transport property, increase the stability of the formed film, and allow a long lifetime to be achieved.

If the content of the hole transporting material in the hole injecting layer and/or hole transporting layer is too low, it will be difficult to obtain the synergistic effect of mixing the hole transporting material. On the other hand, if the content of the hole transporting material is too high, it will be difficult to obtain the effect of using the metal oxide clusters.

(Additives)

The hole injecting layer and/or hole transporting layer of the invention may contain additives such as binder resins, curable resins or coatability enhancers, so long as the effect of the invention is not impeded. Binder resins include polycarbonates, polystyrenes, polyarylates, polyesters etc. A binder resin that cures by heat or light may also be included. As materials that cure by heat or light, there may be used materials having curable functional groups introduced into the molecule of the hole transporting material, or curable resins. Specifically, curable functional groups include acrylic functional groups such as acryloyl groups and methacryloyl groups, as well as vinylene group, epoxy group, isocyanate group, etc. Curable resins include thermosetting resins and photocuring resins, with examples including epoxy resins, phenol resins, melamine resins, polyester resins, polyurethane resins, silicon resins and silane coupling agents.

As binders there may be used hole injecting materials or hole transporting materials that have conventionally been used in organic EL elements. Addition of such binders can improve the film formability, also allowing adjustment of ink viscosity. Specifically, there may be used polyaniline or poly(3,4)ethylenedioxythiophene/polystyrene sulfonate (PE- DOT/PSS, Baytron™ P AI4083, trade name of Starck, commercially available as an aqueous solution).

The film thickness of the hole injecting layer and/or hole transporting layer may be appropriately set according to the purpose and the adjacent layers, but it will usually be 0.1-1000 nm and preferably 1-500 nm.

The work function of the hole injecting layer and/or hole transporting layer is preferably 5.0-6.0 eV and more preferably 5.0-5.8 eV, from the viewpoint of hole injection efficiency.

The hole injecting layer and/or hole transporting layer of the invention may be formed by a coating method. The hole injecting layer and/or hole transporting layer of the invention is formed by a coating method or the like using a fluid material comprising at least metal oxide clusters in uniform solution, or uniform dispersion or mixture.

When a hole injecting layer and/or hole transporting layer containing a hole transporting material is to be formed, a fluid material is prepared having both the metal oxide clusters and the hole transporting material uniformly dissolved, or uniformly dispersed or mixed, and formation is accomplished by a coating method.

In this case, using a fluid material in which both the metal oxide clusters and the hole transporting material are uniformly dissolved in a solvent, or uniformly dispersed or mixed, facilitates stable and uniform coexistence of the metal oxide clusters and the hole transporting material in the hole injecting layer and/or hole transporting layer, thereby allowing a hole injecting layer and/or hole transporting layer with an excellent hole transport property and excellent film stability over time to be formed. Such a hole injecting layer and/or hole transporting layer will tend to be insoluble in the solvent used to form the hole injecting layer and/or hole transporting layer, and even when an organic functional layer is formed corresponding to the upper layer of the hole injecting layer and/or hole transporting layer, there will be a greater possibility of using a coating method, without elution of the hole injecting layer and/or hole transporting layer. The coating method and vapor deposition method will be explained below in the method for producing an organic electronic device.

(2) Substrate

The substrate serves as the support for the organic electronic device of the invention, and for example, it may be a flexible material or a hard material. Specific examples of materials that may be used include glass, quartz, polyethylene, polypropylene, polyethylene terephthalate, polymethacrylate, polymethyl methacrylate, polymethyl acrylate, polyester, polycarbonate and the like. It preferably has a gas barrier property, when using a synthetic resin substrate. The thickness of the substrate is not particularly restricted, but will normally be about 0.5-2.0 mm.

(3) Electrodes

The organic electronic device of the invention has two or more opposing electrodes on the substrate.

The electrodes in the organic electronic device of the invention are preferably formed of metal or a metal oxide, and may usually be formed of a metal such as aluminum, gold, silver, nickel, palladium or platinum or a metal oxide such as indium and/or tin oxide.

(Cathodic Electrode)

The cathodic electrode 6 in the organic electronic device, such as an organic EL element, may be an electrode material that functions to inject electrons into the luminescent layer 5, or a stable metal with a work function of 4.2 eV or greater, but when light emitted by the luminescent layer 5 is to be extracted from the cathode end, the cathodic electrode 6 must be formed of a transparent material.

There are no particular restrictions in an organic solar cell so long as it is a conducting material, and therefore the conducting material used may be the same as the cathode in an organic EL element. When the substrate is the receiving surface, the first electrode will be a transparent electrode, in which case the second electrode does not need to be transparent. When an electrode with a high work function is used as the first electrode, the second electrode has conventionally been a material with a low work function.

In an organic transistor as well, there are no particular restrictions on the conducting material, and therefore the conducting material used may be the same as for the cathode of an organic EL element, with platinum, gold, silver, copper, aluminum, indium, In—Sn—O (ITO) and carbon being particularly preferred.

(Anodic Electrode)

The anodic electrode 1 in the organic electronic device, such as an organic EL element, when it is provided on the luminescent layer of the substrate 7, may be an electrode material that functions to inject holes into the luminescent layer 5, and is preferably a conducting material with a large work function, but most preferably the anodic electrode 1 is formed of at least one type of metal with a work function of 4.2 eV or greater, or an alloy of such metals, or at least one substance included among the conductive inorganic oxides.

When light emitted from at the luminescent layer 5 is to be extracted from the anode end, the anodic electrode 1 must be formed of a transparent material. Examples include metals such as Au, Ta, W, Pt, Ni, Pd, Cr, Cu and Mo, or their oxides or alloys, or built-up structures of such metal materials. There may also be used conductive inorganic oxides such as ITO, In—Zn—O, Zn—O, Zn—O—Al or Zn—Sn—O, or α-Si, α-SiC, or the like. In addition, molten metals that allow formation by wet film forming methods, or metal fine particles or conductive polymers, that are suitable for use in the cathode, may be used.

There are no particular restrictions in an organic solar cell so long as it is a conducting material, and therefore the conducting material used may be the same as the cathode in an organic EL element. It is preferably selected as appropriate in consideration of the direction of light illumination and the work function of the material forming the second electrode. When the substrate is the receiving surface, the first electrode is preferably the transparent electrode, in which case it may be one commonly used as a transparent electrode. Specifically, this includes In—Zn—O (IZO), ITO, ZnO—Al, Zn—Sn—O and the like.

In an organic transistor as well, there are no particular restrictions on the conducting material, and therefore the conducting material used may be the same as for the cathode of an organic EL element, with platinum, gold, silver, copper, aluminum, indium, ITO and carbon being particularly preferred.

According to the invention, a metal layer may be further included to improve the adhesive stability between the electrode and the charge injecting material. A metal layer is a layer containing a metal, and it is formed from a metal or metal oxide that is to be used in the electrode described above.

The thickness of the electrodes will differ depending on the transparency required for each electrode. When transparency is required, the light transmittance of the electrodes in the visible light wavelength range will normally be 60% or greater and preferably 80% or greater, in which case the thickness will usually be 10-1000 nm and preferably about 20-500 nm.

Electrodes are usually formed on substrates by methods such as sputtering or vacuum vapor deposition, but they may also be formed by coating methods such as spin coating or dipping.

In an organic EL element they may usually be formed by vacuum vapor deposition using the metal or metal oxide used to form the electrode, or using a stable metal with a work function of 4.2 eV or greater, but they may also be suitably formed by a coating method. The cathodic electrode 6 is preferably formed by a coating method since this will eliminate the need for a large vapor deposition apparatus and will simplify the fabrication process, compared to vacuum vapor deposition, while the material utilization efficiency is higher, cost is lowered and increased substrate area size becomes possible.

The anodic electrode may be formed using a coating method, if the material used is a molten metal that allows formation by a coating method, or metal fine particles or a conductive polymer, that is suitable for use in the cathode. When other metals are used, the anodic electrode 1 can be formed using a dry process such as sputtering, vacuum heating vapor deposition, EB vapor deposition, ion plating or the like.

The electrodes of the organic luminescent device of the invention may be formed as described above, but preferably either or both the anodic electrode and cathodic electrode are formed by a coating method to allow the advantages of the coating method to be utilized. More preferably, the cathodic electrode is formed by a coating method from the viewpoint of the production process, to eliminate the need for a vacuum apparatus.

(4) Other Components

If necessary, the organic electronic device of the invention may comprise a conventionally known electron injecting layer and/or electron transporting layer between the electron injecting electrode and the organic functional layer.

2. Organic EL element

One embodiment of the organic electronic device of the invention is an organic EL element in which the organic functional layer comprises at least a hole injecting layer and/or a hole transporting layer of the invention, and a luminescent layer.

Each layer composing the organic EL element will now be explained in order using FIGS. 2 to 4.

(Substrate)

The substrate 7 serves as the support for the organic EL element, and for example, it may be a flexible material or a hard material. Specifically, there may be used any of those mentioned above for the substrate of the organic electronic device.

When light emitted at the luminescent layer 5 is to be extracted through the substrate 7 end, at least the substrate 7 must be a transparent material.

(Anode and Cathode)

The electrode 1 and electrode 6 are determined based on which electrode requires transparency, depending on the direction in which light emitted from the luminescent layer 5 is to be extracted, and when light is to be extracted from the substrate 7 end, the electrode 1 must be formed of a transparent material, or if light is to be extracted from the electrode 6 side, the electrode 6 must be made of a transparent material. An electrode 1 provided on the luminescent layer side of the substrate 7 functions as an anode to inject holes into the luminescent layer, while an electrode 6 provided on the luminescent layer side of the substrate 7 functions as a cathode to inject electrons into the luminescent layer 5.

According to the invention, the anode and cathode may be formed using the metals or metal oxides listed above in the explanation for the electrodes of the organic electronic device. The electrode on the light-extracting side of the organic EL element will usually be ITO, since it will need to be a transparent electrode.

(Hole Injecting Layer and Hole Transporting Layer)

The hole injecting layer 2, hole transporting layer 4a and hole transporting layer 4b are formed as appropriate between the luminescent layer 5 and the electrode 1 (anode), as illustrated in FIGS. 2 to 4. As shown in FIG. 2, a hole transporting layer 4a may be further laminated on the hole injecting layer 2 of the invention and a luminescent layer laminated thereover, as shown in FIG. 3, a hole transporting layer 4b of the invention may be further laminated on the hole injecting layer 2 and a luminescent layer laminated thereover, or as shown in FIG. 4, a hole injecting layer 2 and/or a hole transporting layer of the invention may be laminated on the electrode 1 and a luminescent layer further laminated thereover.

When a hole transporting layer 4a is further laminated on a hole injecting layer 2 comprising metal oxide clusters of the invention, as shown in FIG. 2, there are no particular restrictions on the hole transporting material to be used in the hole transporting layer 4a.

When the metal oxide clusters described for the hole injecting layer of the invention are to be used together with a hole transporting material, the same hole transporting material is preferably used in the hole transporting layer 4a. It is preferred to use the same material as the hole transporting material used in the adjacent hole injecting layer 2 of the invention, because the interface between the hole injecting layer and the hole transporting layer will have improved adhesive stability, and this can contribute to an extended driving lifetime.

The hole transporting layer 4a may be formed by the same method as the luminescent layer described hereunder, using a commonly used hole transporting material. The film thickness of the hole transporting layer 4a will usually be 0.1-1 μm and is preferably 1-500 nm.

When a hole transporting layer 4b comprising metal oxide clusters according to the invention is further laminated on a hole injecting layer 2 comprising metal oxide clusters of the invention, as shown in FIG. 3, there are no particular restrictions on the hole transporting material to be used in the hole transporting layer 4b, and a conventionally known compound may be used.

The hole transporting layer 4b may be formed by the same method as for the hole injecting layer, using metal oxide clusters and a hole transporting material in the same manner as for the hole injecting layer comprising metal oxide clusters of the invention. The hole transporting layer is a layer that stabilizes injection of holes from the anodic electrode, or that allows stable transport of injected holes into the luminescent layer.

The film thickness of the hole transporting layer 4b is usually 1 nm-1 μm, preferably 2 nm-500 nm and even more preferably 5 nm-200 nm, from the viewpoint of hole injection efficiency.

In consideration of the hole injection property, preferably the hole injecting material and hole transporting material are selected so that the value of the work function (HOMO) of each layer increases in a stepwise manner from the electrode 1 side toward the luminescent layer 5 as the organic functional layer, minimizing the energy barrier for hole injection at each interface, to compensate for the large energy barrier for hole injection between the electrode 1 and luminescent layer 5.

Specifically, when using ITO (work function immediately after UV ozone cleaning: 5.0 eV) as the electrode 1 and using 4,4'-bis(2,2-carbazol-9-yl)biphenyl (hereunder, "CBP") (HOMO: 5.9 eV) for the luminescent layer 5, for example, the large energy barrier for hole injection between the electrode 1 (work function immediately after UV ozone cleaning: 5.0 eV) and the luminescent layer 5 (for example, HOMO: 5.9 eV) can be compensated for step-wise HOMO values, and preferably the material for the hole injecting layer and/or hole transporting layer is selected to be a mixture of [(9,9-dioctylfluorenyl-2,7-diyl)-co-(4,4'-(N-(4-sec-butylphenyl))dphenylamine)] (hereunder, "TFB") (work function: 5.4 eV) and metal oxide clusters (work function: 5.0-5.7 eV), in a configuration for a laminar structure in which the value of the work function of each layer increases in order from the electrode 1 side toward the luminescent layer 5, whereby it is possible to obtain a hole injecting layer and/or a hole transporting layer having very excellent hole injection efficiency.

The work function or HOMO values are given as the measured values by photoelectron spectroscopy using an AC-1 photoelectron spectroscope (product of Riken Keiki Co., Ltd.).

(Luminescent Layer)

The luminescent layer 5 is formed of a luminescent material between the substrate 7 on which the electrode 1 has been formed, and the electrode 6, as shown in FIGS. 2 to 4.

The material used for the luminescent layer of the invention is not particularly restricted so long as it is a material commonly used as a luminescent material, and any fluorescent material or phosphorescent material may be used. Specifically, these include materials such as dye-based luminescent materials, metal complex-based luminescent materials and polymer-based luminescent materials. From the viewpoint of simplifying the production process and lowering costs, as objects of the invention, it is preferred to select a luminescent material that allows a coating method to be employed.

(Specific Examples of Dye-Based Luminescent Materials)

Organic dye-based compound derivatives can usually be used as dye-based luminescent materials. Examples of triphenylamine derivatives include N,N'-bis-(3-methylphenyl)-N, N'-bis-(phenyl)-benzidine (TPD), 4,4,4-tris(3-methylphenylphenylamino)triphenylamine (MTDATA), arylamines such as bis(N-(1-naphthyl-N-phenyl)benzidine) (α-NPD) oxadiazole derivatives such as (2-(4-biphenylyl)-5-(4-tertbutylphenyl)-1,3,4-oxadiazole) (PBD), anthracene derivatives such as 9,10-di-2-naphthylanthracene (DNA), carbazole derivatives such as 4,4-N,N'-dicarbazole-biphenyl (CBP), and 1,4-bis(2,2-diphenylvinyl)benzene (DPVBi), phenanthrolines, such as bathocuproine, and bathophenanthroline and the like. Dimers, trimers or oligomers, as compounds with two or more of these derivatives, may also be used. Such materials may be used alone, or two or more may be used in combination.

(Specific Examples of Metal Complex-Based Luminescent Materials)

Examples of metal complex-based luminescent materials include alumiquinolinol complexes, benzoquinolinol-beryllium complexes, benzooxazole-zinc complexes, benzothiazole-zinc complexes, azomethyl-zinc complexes, porphyrinzinc complexes, europium complexes and the like, or metal complexes having Al, Zn, Be or the like or rare earth metals such as Tb, Eu or Dy as the central metal, and an oxadiazole, thiadiazole, phenylpyridine, phenylbenzimidazole or quinoline structure as the ligand.

Specifically, these include tris(8-quinolinolato)aluminum complex ($Alq_3$), bis(2-methyl-8-quinolilato)(p-phenyl phenolate)aluminum complex (BAlq), tri(dibenzoylmethyl) phenanthroline-europium complex and bis(benzoquinolinolato)beryllium complex (BeBq). Such materials may be used alone, or two or more may be used in combination.

(Polymer-Based Luminescent Material)

The polymer-based luminescent material used may have a low molecular material introduced as straight-chains or side-chains or as functional groups in the molecule, or it may be a polymer or dendrimer.

Examples include polyparaphenylene-vinylene derivatives, polythiophene derivatives, polyparaphenylene derivatives, polysilane derivatives, polyacetylene derivatives, polyvinylcarbazoles, polyfluorenone derivatives, polyfluorene derivatives, polyquinoxaline derivatives, and copolymers of the foregoing.

(Specific Examples of Dopants)

A doping material may be added to the luminescent layer for increased luminous efficiency or to alter the luminous wavelength. For polymer-based materials, they may include it in the form of luminescent groups in the molecular structure. Examples of such doping materials include perylene derivatives, coumarin derivatives, rubrene derivatives, quinacridone derivatives, squalium derivatives, porphyrin derivatives, styryl-based dyes, tetracene derivatives, pyrazoline derivatives, decacyclenes, phenoxazones, quinoxaline derivatives, carbazole derivatives and fluorene derivatives.

Specifically, there may be mentioned 1-tert-butyl-perylene (TBP), coumarin 6, Nile Red, 1,4-bis(2,2-diphenylvinyl)benzene (DPVBi) and 1,1,4,4-tetraphenyl-1,3-butadiene (TPB). These materials may be used alone or in combinations of two or more.

As phosphorescent dopants there may be used organometallic complexes that have heavy metal ions such as platinum or iridium as centers and exhibit phosphorescence. Specifically, there may be used $Ir(ppy)_3$, $(ppy)_2Ir(acac)$, $Ir(BQ)_3$, $(BQ)_2Ir(acac)$, $Ir(THP)_3$, $(THP)_2Ir(acac)$, $Ir(BO)_3$, $(BO)_2(acac)$, $Ir(BT)_3$, $(BT)_2Ir(acac)$, $Ir(BTP)_3$, $(BTP)_2Ir(acac)$, $FIr_6$, PtOEP and the like. These materials may be used alone or in combinations of two or more.

The method of forming the luminescent layer is not particularly restricted so long as it is one allowing high-definition patterning, and it may be formed by a coating method, vapor deposition method or transfer method using a luminescent material.

The coating method used may be the same method explained for the method for producing an organic electronic device, described hereunder.

In a vapor deposition method, such as vacuum vapor deposition, the material for the luminescent layer is placed in a crucible set in a vacuum container, the vacuum container interior is evacuated to about $10^{-4}$ Pa with a vacuum pump, and then the crucible is heated for evaporation of the luminescent layer material, to form a luminescent layer 5 on the stack comprising the substrate 7, electrode 1, hole injecting layer 2 and/or hole transporting layer and hole transporting layer 4a, which is facing the crucible.

In a transfer method, for example, a luminescent layer pre-formed on a film by a coating method or vapor deposition method is attached to the hole injecting layer 2 and/or hole transporting layer formed on an electrode, and then heated for transfer of the luminescent layer 5 onto the hole injecting layer 2 and/or hole transporting layer. The hole injecting layer and/or hole transporting layer side of the stack comprising the film, luminescent layer 5, hole injecting layer 2 and/or hole transporting layer laminated in that order may also be transferred onto the electrode.

The present invention is advantageous because the hole injecting layer and/or hole transporting layer can be suitably formed by a coating method, and therefore forming the luminescent layer as well by a coating method can lower process cost.

The film thickness of the luminescent layer is not particularly restricted so long as it is a thickness that provides a site for recombination of the electrons and holes so that a luminescent function can be exhibited, but it may usually be 1-500 nm and is preferably about 20-200 nm.

3. Organic Transistor

An organic transistor is yet another embodiment of an organic electronic device according to the invention. Each of the layers composing an organic transistor will now be explained with reference to FIG. 5 and FIG. 6.

The organic transistor of the invention shown in FIG. 5 has the hole injecting transporting layer 2b formed on the surfaces of the electrode 1 (source electrode) and electrode 6 (drain electrode), and therefore the hole injecting transporting capacity between the electrodes and the organic transistor layer is increased and the film stability of the hole injecting transporting layer of the invention is increased, thereby contributing to a longer driving lifetime.

The organic transistor of the invention may have the hole injecting transporting layer 2b of the invention functioning as the organic transistor layer 8, as shown in FIG. 6.

The organic transistor of the invention may also have the hole injecting transporting layer 2b formed on the surfaces of the electrode 1 (source electrode) and the electrode 6 (drain electrode), as shown in FIG. 5, or the hole injecting transporting layer 2b of the invention may be formed of a different material from the hole injecting transporting layer formed on the electrode surface as the organic transistor layer 8.

When an organic transistor such as shown in FIG. 5 is to be formed, the material used to form the organic transistor layer may be a donor-type (p-type) low molecular or high molecular organic transistor material.

The organic transistor material may be an organic material commonly used in organic transistors, for example, porphyrin derivatives, such as phthalocyanine or a metal phthalocyanine such as copper phthalocyanine, arylamine derivatives such as m-TDATA, or polyacene derivatives such as naphthalene, anthracene, naphthacene or pentacene. Many derivatives may also be used, including perylene derivatives, rubrene derivatives, coronene derivatives, polythiophene derivatives, polyparaphenylene derivatives, polyparaphenylenevinylene derivatives, polypyrrole derivatives, polyaniline derivatives and polyfluorene derivatives. In addition, a Lewis acid or tetracyanoquinodimethane tetrafluoride ((F4-TCNQ), or an inorganic oxide such as vanadium or molybdenum, may be mixed with such porphyrin derivatives or triphenylamine derivatives for use as a layer with increased conductivity.

Even when forming an organic transistor comprising a hole injecting transporting layer of the invention, as shown in FIG. 5, it is preferred for the compound composing the organic transistor layer 8 to be the hole transporting material used in the hole injecting transporting layer of the invention, and especially a hole transporting polymer compound, from the viewpoint of increasing the adhesive stability at the interface between the hole injecting transporting layer 2b of the invention and the organic transistor layer 8, and of contributing to an extended lifetime.

The carrier mobility of the organic transistor layer is preferably at least $10^{-6}$ cm/Vs, and especially at least $10^{-3}$ cm/Vs with respect to the organic transistor, from the viewpoint of the transistor characteristics.

The organic transistor layer may be formed by a coating method or a dry process, similar to the luminescent layer of the organic EL element.

There are no particular restrictions on the substrate, gate electrode, source electrode, drain electrode and insulating layer, and they may be formed using the following materials, for example.

The substrate 7 serves as the support for the organic electronic device of the invention, and for example, it may be either a flexible material or a hard material. Specifically, the same material may be used as for the substrate of the organic EL element.

The gate electrode, source electrode and drain electrode are not particularly restricted so long as they are conducting materials, but they are preferably metals or metal oxides from the viewpoint of forming a hole injecting transporting layer 2b in which a metal ion-coordinated compound is adsorbed, using the charge transport material of the invention. Specifically, the same metal or metal oxide may be used as for the electrode in the organic EL element, although platinum, gold, silver, copper, aluminum, indium, ITO and carbon are preferred.

Various commonly employed insulating materials may be used in the insulating layer for insulation of the gate electrode, and either an inorganic oxide or organic compound may be used, although an inorganic oxide with a high relative permittivity is especially preferred. Silicon oxide, aluminum oxide, tantalum oxide and titanium oxide are most preferably used as inorganic oxides. Silicon nitride, aluminum nitride and the like may also be suitably used as inorganic nitrides.

As organic compounds, there may be used polyimides, polyamides, polyesters, polyacrylates, photoradical polymerizable and photocationic polymerizable photocuring resins, or acrylonitrile component-containing copolymers, polyvinylphenols, polyvinyl alcohols, novolac resins, cyanoethylpullulan, and phosphazene compounds including polymers or elastomers.

4. Method for Producing Organic Electronic Device

The method for producing an organic electronic device of the invention is a method for producing an organic electronic device having two or more opposing electrodes on a substrate, and an organic functional layer including at least a hole injecting layer situated between the two electrodes, the method comprising a step of forming a hole injecting layer and/or hole transporting layer on any layer of the electrodes using a material which comprises chemically synthesized metal oxide clusters that include at least one metal element selected from among elements of Group 5, Group 6 or Groups 8-10 of the Periodic Table, the metal oxide clusters being polyoxometalates, or in other words a step of laminar formation of a hole injecting layer and/or hole transporting layer containing metal oxide clusters comprising a polyoxometalate including at least one metal element selected from among elements of Group 5, Group 6 or Groups 8-10 of the Periodic Table, from a fluid material comprising the metal oxide clusters either alone, or in uniform admixture with a hole transporting material such as an aromatic amine-based compound.

The method for producing an organic electronic device according to the invention comprises a step of forming a hole injecting layer and/or hole transporting layer using a material that comprises metal oxide clusters including at least one metal element selected from among elements of Group 5, Group 6 or Groups 8-10 of the Periodic Table, the metal oxide clusters being polyoxometalates, wherein a fluid material is prepared in which there is uniformly dissolved, or uniformly dispersed or mixed, a material that comprises metal oxide clusters including at least one metal element selected from among elements of Group 5, Group 6 or Groups 8-10 of the Periodic Table, the metal oxide clusters being polyoxometalates, and a thin-film comprising the metal oxide clusters is formed on the anode, to form the hole injecting layer and/or hole transporting layer.

During formation of the hole injecting layer and/or hole transporting layer, it is possible to accomplish layer formation by means other than vapor deposition, without the need for a vapor deposition apparatus and without using mask vapor deposition or the like, to increase productivity, and to allow formation of an organic electronic device having high adhesive stability at the interface between the electrodes and the hole injecting layer and/or hole transporting layer, and between the interface between the hole injecting layer and/or hole transporting layer and the organic functional layer.

In the step of forming the hole injecting layer and/or hole transporting layer, a material comprising metal oxide clusters including at least one metal element selected from among elements of Group 5, Group 6 or Groups 8-10 of the Periodic Table, wherein the metal oxide clusters are polyoxometalates, and if necessary a hole transporting material, as well as additives such as a binder resin or coatability improver that does not trap holes, are added, with or without a solvent, to prepare a uniformly dissolved or a uniformly dispersed or mixed fluid material, and the fluid material is coated onto an electrode or layer serving as the base layer, and heat dried into a thin-film to form a hole injecting layer and/or hole transporting layer.

By forming the hole injecting layer and/or hole transporting layer by a coating method, the advantages of the coating method can be realized. That is, during formation of the hole injecting layer and/or hole transporting layer, it is possible to accomplish separate coatings without the need for a vapor deposition apparatus and without using mask vapor deposition or the like, to increase productivity, and to allow formation of an organic electronic device having high adhesive stability at the interface between the electrodes and the hole injecting layer and/or hole transporting layer, and between the interface between the hole injecting layer and/or hole transporting layer and the organic functional layer.

A coating method is a method used for coating of a molten fluid or solution of a material, or a fluid material comprising a uniformly dispersed or mixed material, specific examples of which include not only common coating methods such as spin coating, dipping, roll coating, casting, bar coating, blade coating, spray coating and die coating, but also methods of patterning by printing or an ink-jet method, including gravure printing, flexographic printing and ink-jet methods, while immersion and dipping may also be used when a simple molecular film is to be formed.

For formation of the hole injecting layer and/or hole transporting layer of the invention, it is preferred to use spin coating or an ink-jet method.

A fluid material is, generally, a material that may be either liquid or solid, and more specifically, it includes liquid materials such as molten materials, solutions and dispersions, alone or as mixed materials, and powder materials such as powders, fluids, fine particles or aggregates, alone or as mixed materials.

The fluid material of the invention is preferably one that is dissolved in a solvent, and it is preferably an aqueous solution dissolved in an aqueous medium.

The solvent used for preparation of the fluid material is not particularly restricted so long as it comprises metal oxide clusters and if necessary other components such as a hole transporting material, satisfactorily dissolved or dispersed, and for example, there may be used aqueous media such as water or alcohol-based media, organic solvents such as toluene, xylene, dodecylbenzene, cyclohexanone, cyclohexanol, tetralin, mesitylene, anisole, methylene chloride, tetrahydrofuran, dichloroethane, chloroform, ethyl benzoate and butyl benzoate, or mixed solvents comprising aqueous solvents and organic solvents.

According to the invention, the metal oxide clusters including at least one metal element selected from among elements of Group 5, Group 6 or Groups 8-10 of the Periodic Table are preferably chemically synthesized metal oxide clusters that dissolve in a solvent, and the solvent used for preparation of the fluid material comprising metal oxide clusters is most preferably an aqueous medium such as water and/or an alcohol-based medium, which will not adversely affect the environment.

In the method for producing an organic electronic device of the invention, the hole transporting material added to the hole injecting layer and/or hole transporting layer comprising the metal oxide cluster of the invention may be an aromatic amine-based compound that is commonly employed in the technical field.

In order to maximally utilize the solubility in solvents including aqueous media, which is one of the excellent properties of the metal oxide clusters of the invention to be used as a hole injecting/transporting material, and in order to maintain or improve the hole injection/transport property of the metal oxide clusters, the aromatic amine-based compounds used as a hole transporting material may be compounds that are soluble in aqueous media, or a compounds that have been altered to be soluble in aqueous media by modification of functional groups such as hydroxyl or carboxyl groups, to allow preparation of a homogeneous fluid material by uniform dissolution in a solvent or uniform dispersion, together with the metal oxide clusters, so that the simple layer-forming method of coating may be used to form a uniform layer comprising the metal oxide clusters of the invention.

Also, by using a hole injecting layer and/or hole transporting layer that comprises metal oxide clusters which are polyoxometalates including at least one metal atom selected from among elements of Group 5, Group 6 or Groups 8-10 of the Periodic Table, and an aromatic amine-based compound that is soluble in solvents such as aqueous media together with the metal oxide clusters, it is possible to maintain adhesiveness with adjacent organic functional layers while reasonably improving the hole injection/transport property and increasing the film strength.

The other steps in the method for producing an organic electronic device may be steps known in the prior art, as appropriate.

The present invention will now be explained in greater detail, by examples using as the metal oxide clusters relatively low-molecular-weight metal oxide clusters that are commercially available, and high-molecular-weight metal oxide clusters that are not available, such as used in the following synthesis examples, and more specifically, using metal oxide clusters containing molybdenum or tungsten as transition metal elements of Group VI of the Periodic Table, or vanadium of Group V, in the hole injecting layer. However, it is to be understood that the invention is not restricted by the examples.

The organic EL elements and organic diodes fabricated in the examples and comparative examples were measured and evaluated as follows, in regard to film thickness, cluster particle size, metal element valency, current efficiency, driving voltage property (AC/DC conversion property), lifetime characteristic and IR analysis.

[Evaluation Methods]
(1) Film Thickness Measurement

The film thickness of each layer composing the organic electronic device of the invention is not the measured value obtained by analyzing an actually produced organic electronic device, but instead, unless otherwise specified, the film thickness of each constituent layer of the organic electronic device was determined by forming each layer alone on a cleaned ITO-attached glass panel (Sanyo Vacuum Industries Co., Ltd.), under the same conditions as for formation of the thin-film used to form each layer composing each organic electronic device, and measuring the level difference between the produced thin-film and the ITO surface.

A probe microscope (Nanopics1000, product of SII Nano-Technology Inc.) was used for measurement of the film thickness.

(2) Particle Size Measurement

The particle sizes of the metal oxide clusters of the invention were measured as the volume-average particle size and number-mean particle size, by the dynamic light scattering method. A dynamic light scattering measuring apparatus (UPA-EX150 Nanotrac particle size distribution analyzer by Nikkiso Co., Ltd.) was used for the measurement. The measuring sample used was a solution of molybdenum oxide clusters in distilled water (concentration: 4.6 mg/ml). The sample was dissolved in distilled water to 0.4 wt % and dissolved with ultrasonic waves for 1 hour, after which it was placed in a 80 degree water bath for 10 minutes and further subjected to ultrasonic waves for 1 hour, and the solution filtered with a 0.2 μm filter was measured.

(3) Valency Measurement

In order to examine the ratio of the different oxidation numbers of metals in the organic-inorganic complex oxides synthesized from the metal complexes, measurement was performed by XPS (X-ray photoelectron spectroscopy) and compared. The measurement was conducted using a X-ray photoelectron spectroscope (Theta-Probe, Thermo Fisher Scientific, KK.), with X-ray source: Monochromated AlKα (monochromated X-rays), X-ray irradiation region (=measuring region): 400 μmcφ, X-ray output: 100 W, lens mode: Standard, photoelectron acceptance angle: 53° (with normal to the sample as 0°), charge neutralization: electron flood gun (+6 V, 0.05 mA), low-speed $Ar^+$ ion irradiation.

(4) Current Efficiency and Driving Voltage of Organic EL Element

The current efficiency and driving voltage of the organic EL elements fabricated for the examples were evaluated. The driving voltage was measured with driving of the organic EL element at a constant current density of 10 mA/cm$^2$, and the luminescent brightness was measured using an SR-2 spectroradiometer by Topcon Corp. The luminous efficiency (cd/A) was calculated from the luminescence area, the current density and the brightness, based on the obtained results.

(5) Organic EL Element Lifetime Measurement

The time to half-brightness was measured for the organic EL elements fabricated in the examples. The decay in brightness was recorded while maintaining a constant current density after driving at an initial brightness of 20,000 (cd/m$^2$), and the time to half-brightness was measured.

(6) IR Analysis Method

Successful synthesis of metal oxide clusters was confirmed by Fourier transform infrared spectroscopy (FT-IR) and Raman spectroscopy.

For analysis by FT-IR, an FT-IR apparatus by Varian (FTS6000) was used for measurement by the KBr method. The intensity distribution at each wavelength was measured by FT-IR to analyze the type of elements composing the metal oxide clusters and the bonded states (atomic groups and partial structures), as well as their amounts.

A LabRAM HR-800L Laser Raman Spectrometer by Horiba, Ltd. was used for the Raman spectroscopy. Measurement was performed using a 514 nm laser, with a grating of 1800 lines and a total number of 10 scans, the absorbance wavenumber was observed, and the types of constituent metal elements and the metal element/oxygen bonds were analyzed.

(7) Work Function Measurement

The work function of the hole injecting layer of the invention was determined by measuring the energy value at which photoelectrons were emitted using an AC-1 photoelectron spectroscope.

Synthesis Example 1

Synthesis Method for Water-Soluble Mo154 Clusters 1

After placing a magnetic stirrer in a 100 mL round-bottomed flask, disodium molybdate(VI) dihydrate (3.04 g), distilled water (25 mL) and 35% hydrochloric acid (2.47 mL) were added. Next, sodium dithionite (0.15 g) was added and the mixture was stirred at room temperature for 24 hours. The mixture was then allowed to stand for 5 days and the precipitated dark blue solid was filtered out and rinsed with cold water. The dark blue oily matter was transferred to a sample bottle and dried in a desiccator, to obtain dark blue solid water-soluble molybdenum oxide clusters (hereunder referred to simply as "Mo clusters 1") (1.46 g).

Successful synthesis of Mo clusters 1 was confirmed by Fourier transform infrared spectroscopy (FT-IR) and Raman spectroscopy.

In FT-IR, an FT-IR apparatus by Varian (FTS6000) was used for measurement by the KBr method. The intensity distribution at each wavelength was measured by FT-IR to analyze the type of elements composing the molybdenum oxide clusters and the bonded states (atomic groups and partial structures), as well as their amounts.

As a result, absorption was observed at the following wavenumbers: vcm$^{-1}$, 1617, 974, 912, 820, 747, 632, 557. The values of the wavenumbers with absorption matched the characteristic absorbance wavenumbers for water-soluble Mo154 clusters listed in Non-patent document 1.

A LabRAM HR-800L Laser Raman Spectrometer by Horiba, Ltd. was used for the Raman spectroscopy. Measurement was performed using a 514 nm laser, with a grating of 1800 lines and a total number of 10 scans.

As a result, absorption was observed at the following wavenumbers, and bonding between molybdenum and oxygen was thus confirmed. Resonance Raman bands (solid; λe=514 nm): v(cm$^{-1}$)=997, 824, 666, 465, 379, 339, 290, 242, 216, 199, 154, 129, 119.

Synthesis Example 2

Synthesis Method for Water-Soluble Mo146 Clusters 2

After placing a magnetic stirrer in a 100 mL round-bottomed flask, disodium molybdate(VI) dihydrate (3.04 g), distilled water (25 mL), 35% hydrochloric acid (2.47 mL) and formic acid (1 mL) were added. Next, sodium dithionite (0.15 g) was added and the mixture was stirred at room temperature for 24 hours. The mixture was then allowed to stand for 5 days and the precipitated dark blue solid was filtered out and rinsed with cold water. The dark blue oil was transferred to a sample bottle and dried in a desiccator, to obtain dark blue solid water-soluble molybdenum oxide clusters (hereunder referred to simply as "Mo clusters 2") (0.43 g). Absorption wavenumbers:
νcm$^{-1}$,1617, 974, 912, 820, 747, 632, 557.

Comparative Synthesis Example

Preparation of MoO$_3$ Slurry

After placing 0.3 g of MoO$_3$ powder, 30 g of toluene solvent and 30 g of zirconia beads having diameters of 3 mm in a paint shaker (product of Asada Iron Works Co., Ltd.), it was used for 6 hours of physical pulverizing to obtain a primary toluene dispersion of MoO$_3$. Next, zirconia beads with diameters of 0.3 mm were added to the supernatant dispersion and dispersed therein for 24 hours. The supernatant dispersion was then filtered with a 0.2 µm filter to prepare a MoO$_3$ slurry. Upon confirming the particle sizes of the MoO$_3$ particles in the slurry, the volume-average particle size was 53.2 nm and the number-mean particle size was 25.0 nm.

(Measurement of Molybdenum Oxide Valency of Hole Injecting Layer)

In order to examine the ratio of molybdenum with oxidation number+6 and oxidation number+5 in the organic-inorganic complex oxide synthesized from the molybdenum complex in the synthesis example described above, two samples, Synthesis Example 1 and the Comparative Synthesis Example, were measured by X-ray photoelectron spectroscopy (XPS) and compared.

The measurement results are shown in Table 1. Table 1 shows the results of separating the peaks for hexavalent molybdenum and pentavalent molybdenum, with the peak intensity for pentavalent molybdenum represented in relation to 100 for hexavalent molybdenum.

Mo clusters 1: A coating ink for a hole injecting layer-forming coating solution was prepared by dissolving 0.05 g of Na$_{15}$[Mo$^{VI}_{126}$Mo$^{V}_{28}$O$_{462}$H$_{14}$(H$_2$O)$_{70}$]$_{0.5}$ [MO$^{VI}_{124}$Mo$^{V}_{28}$O$_{457}$H$_{14}$(H$_2$O)$_{68}$]$_{0.5}$·400H$_2$O clusters, as the aqueous polyoxometalates chemically synthesized in synthesis method 1, in 5 grams of distilled water. The coating ink was used for coating onto a cleaned glass panel to a dried hole injecting layer film thickness of 40 nm, and the thin-film was shaved off with a cutter to obtain a powder as sample 1.

MoO$_3$ vapor deposition film: A MoO$_3$ film (100 nm) formed on a glass panel by vapor deposition in a vacuum by a resistance heating method was shaved off with a cutter to obtain a powder as sample 2.

TABLE 1

|  | Pentavalent Mo 3d5/2 231.2 eV | Hexavalent Mo 3d5/2 232.5 eV |
| --- | --- | --- |
| Mo clusters | 17 | 100 |
| MoO$_3$ vapor deposition film | 0 | 100 |

(Measurement Results)

The valencies detected for molybdenum in the thin-film of Mo clusters 1 (sample 1) were pentavalent and hexavalent, with a pentavalent molybdenum ratio of 17, while the ratio of pentavalent molybdenum predicted from the molecular structure was 22. Despite a slight difference in the two values, attributed to measurement error and film quality including crystallinity, a large amount of pentavalent molybdenum was clearly present.

In the MoO$_3$ vapor deposition film, on the other hand, pentavalent molybdenum was below the detection limit, and only the hexavalent form was detected.

A photoelectron spectroscope AC-1 was also used to determine the work functions for sample 1 and sample 2. As the measuring conditions, measurement was conducted with 0.05 eV energies, to a light quantity of 50 nW for the molybdenum cluster and a light quantity of 200 nW for MoO$_3$.

As a result, the work function of the molybdenum clusters of Synthesis Example 1 was 5.75 eV and that of MoO$_3$ was 5.63 eV. The measurement results for MoO$_3$ roughly matched the listed value to a precision of ±0.05 eV.

(Particle Sizes of Synthesized Molybdenum Oxide Clusters)

In order to measure the mean particle size of the synthesized Mo clusters 1, the Mo clusters 1 (Mo154) were dissolved in distilled water to 0.4 wt % and dissolved with ultrasonic waves for 1 hour, after which the solution was placed in a 80 degree water bath for 10 minutes and further subjected to ultrasonic waves for 1 hour, and then the solution filtered with a 0.2 µm filter was measured.

The volume-average particle size MV (Mean Volume Diameter) was 123 nm and the number-mean particle size MN (Mean Number Diameter) was 4 nm, with a measuring intensity of L.I. 0.045. The Mo154 was donut-shaped and had diameters of approximately 4 nm, which roughly matched the measuring results of 4 nm for the number average.

(Synthesis Scheme for Formula I)

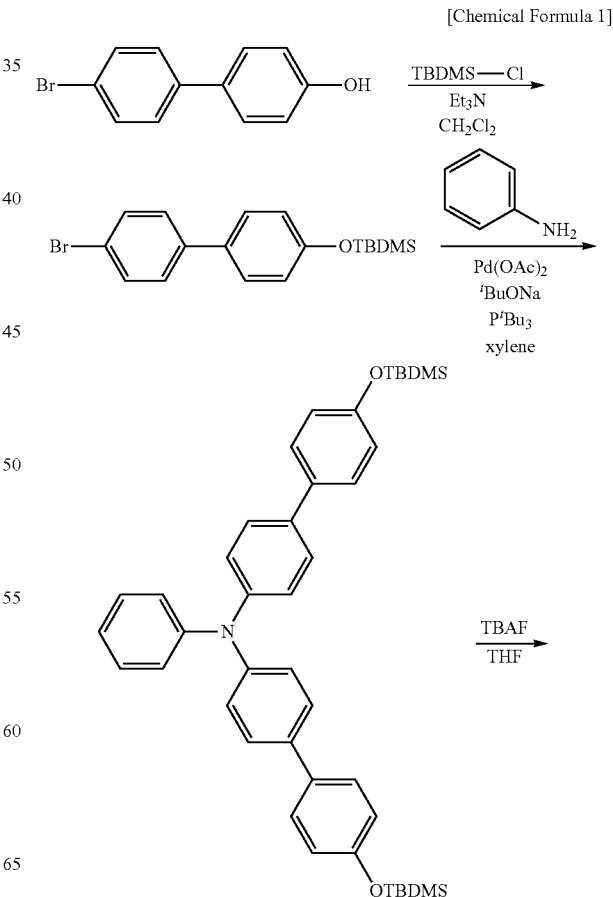

-continued

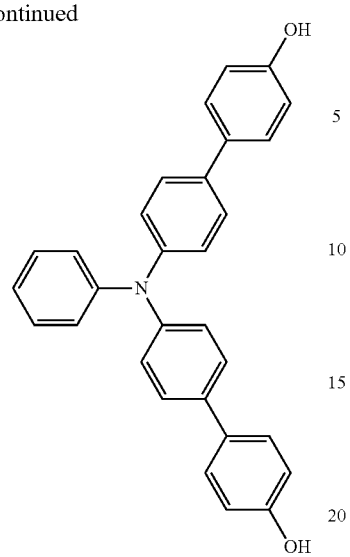

[Reagents Used and Determination of Structure]

Commercial products such as anhydrous dichloromethane, triethylamine, anhydrous magnesium sulfate, anhydrous xylene, tris-t-butylphosphine, palladium acetate, sodium t-butoxide, aniline, hexane, chloroform, 4'-bromo-4-hydroxybiphenyl, t-butyldimethylsilane chloride and tetrabutylammonium fluoride 1.0 M THF solution may be used directly.

The structure of the synthesized compound was confirmed using a nuclear magnetic resonance apparatus (JNM-LA400WB by JEOL Corp.).

[Synthesis of Intermediate 1]

After introducing argon gas into a reactor for 30 minutes to exchange the reaction system interior, anhydrous dichloromethane (70 mL), 4'-bromo-4-hydroxybiphenyl (10 g, 40 mmol) and triethylamine (11 mL, 80 mmol) were added, the reaction system was cooled to 0° C., and t-butyldimethylsilane chloride (6.6 g, 44 mmol) was added over a period of 30 minutes. After slowly returning the mixture to room temperature, it was stirred for 13 hours. Dichloromethane (200 mL) was added to the obtained brown suspension of the reaction mixture, and after rinsing with water (300 mL×1) and brine (300 mL×1), it was dried over anhydrous magnesium sulfate. The solvent was distilled off under reduced pressure to obtain the crude product as a pale red solid. The product was provided for flash column chromatography (silica gel: 250 g, elution solvent: hexane/ethyl acetate=9/1) to obtain a colorless solid intermediate 1 (13 g, 36 mmol, 90% yield).

[Synthesis of Intermediate 2]

After introducing argon gas into the reactor for 30 minutes to exchange the reaction system interior, anhydrous xylene (100 mL), tris-t-butylphosphine (0.37 mL, 1.6 mmol), palladium acetate (0.093 g, 0.41 mmol) and sodium t-butoxide (1.9 g, 20 mmol) were added, the mixture was stirred at room temperature for 10 minutes, and then intermediate 1 (6 g, 16.5 mmol) was added prior to further stirring for 10 minutes. Next, aniline (0.9 g, 9.7 mmol) was added, the mixture was heated to reflux for 6 hours and returned to room temperature, chloroform (100 mL) was added, and the mixture was rinsed with water (200 mL×1) and brine (200 mL×1) and dried over anhydrous magnesium sulfate. The solvent was distilled off under reduced pressure to obtain the crude product as a pale red solid. The product was provided for flash column chromatography (silica gel, elution solvent: hexane/chloroform=1/1) to obtain a colorless solid intermediate 2 (3.3 g, 5 mmol, 60% yield).

[Synthesis of Formula I]

[Chemical Formula 2]

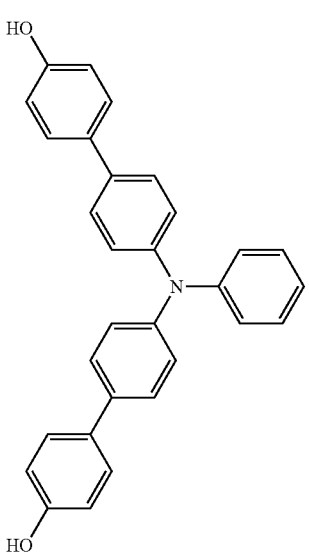

I

After adding intermediate 2 (1.5 g, 2.3 mmol) and anhydrous THF (10 mL) to a reactor, a 1.0 M THF solution of tetrabutylammonium fluoride (5 mL, 5 mmol) was added dropwise and the mixture was stirred at room temperature for 2 hours. Ethyl acetate (30 mL) was added, and the mixture was rinsed with water (30 mL×3) and brine (100 mL×1) and dried over anhydrous magnesium sulfate. The solvent was distilled off under reduced pressure to obtain the crude product as a brownish-white solid. The product was provided for flash column chromatography (silica gel, elution solvent: hexane/chloroform=10/1) to obtain a colorless solid compound of formula I (0.9 g, 2.1 mmol, 91% yield). Based on the NMR chart for the obtained compound, peaks appeared at $_1$H NMR (400 MHz, CDCl$_3$) δ7.46 (m, 8H, ArH), 7.28 (m, 2H, ArH), 7.15 (m, 6H, ArH), 7.02 (t, 1H, ArH), 6.84 (d, 4H, ArH), 4.80 (brs, 2H, ArOH), thus confirming that a compound of formula I had been produced.

EXAMPLES

The present invention will now be explained in greater detail by the following examples of organic EL elements. However, the invention is not limited to the examples described below.

The organic EL element of the invention employs a coating film formed by coating a coating ink comprising aqueous Mo clusters dissolved in an aqueous solvent, as a hole injecting layer and/or hole transporting layer, on a transparent anode-attached glass panel, the film being formed by lamination to have a basic laminar structure comprising an anode, hole injecting layer, hole transporting layer, two hole transporting layers, luminescent layer, hole block layer, electron transporting layer, electron injecting layer and cathode, and sealing to fabricate a green light-emitting organic EL element, and the characteristics of the organic EL element were evaluated.

Example 1

The substrate used was prepared by coating a photosensitive resist onto the ITO anode of an ITO-attached glass panel (product of Sanyo Vacuum Industries Co., Ltd., ITO film thickness: 150 nm) and performing mask exposure, development, and etching for strip pattern formation to obtain a pattern-formed ITO substrate, and this was subjected to ultrasonic cleaning with a neutral cleanser and ultrapure water in that order, and to UV ozone treatment. Next, 0.04 g of $Na_{15}[Mo^{VI}_{126}Mo^{V}_{28}O_{462}H_{14}(H_2O)_{70}]_{0.5}[Mo^{VI}_{124}Mo^{V}_{28}O_{457}H_{14}(H_2O)_{68}]_{0.5} \cdot 400OH_2O$ clusters, as the aqueous polyoxometalate chemically synthesized in Synthesis Example 1 (also referred to as "Mo154 clusters" or "Mo clusters 1") was dissolved in 10 g of distilled water to prepare a coating ink as a hole injecting layer-forming coating solution. The coating ink was used for coating by spin coating onto the cleaned anode to a dry hole injecting layer film thickness of 10 nm, to form a hole injecting layer coating film. After forming the coating film, a hot plate was used for evaporation of the moisture in the thin-film, whereby the coating film was heat-dried at 200° C. for 10 minutes. For a facilitated production process, resistance to shorts and increased production yield, the step of forming a hole injecting layer coating film with a long lifetime and the step of drying the coating film, were both carried out in air.

The hole transporting material used on the hole injecting layer was bis(N-(1-naphthyl-N-phenyl)benzidine (hereunder, "α-NPD"), and vapor deposition formation of the hole transporting layer was carried out in a vacuum (Pressure: $1\times10^{-4}$ Pa), with temperature control for a vapor deposition speed of 0.1 nm/sec. by a resistance heating method, to a film thickness of 100 nm.

A luminescent layer was then vapor deposited on the hole transporting layer. The luminescent layer was obtained using tris(2-phenylpyridine)iridium(III) ($Ir(ppy)_3$) as the luminescent dopant and 4,4'-bis(2,2-carbazol-9-yl)biphenyl (CBP) as the host, added for a host/dopant volume ratio of 20:1, to form a mixed vapor deposition thin-film in a vacuum (pressure: $1\times10^{-4}$ Pa) by covapor deposition using a resistance heating method, to a total film thickness of 40 nm.

A hole block layer was vapor deposited on the luminescent layer. The hole block layer was vapor deposited using a bis (2-methyl-8-quinolilato)(p-phenyl phenolate) aluminum complex (BAlq) as the block-forming material, by a resistance heating method in a vacuum (pressure: $1\times10^{-4}$ Pa), to a BAlq vapor deposition film thickness of 15 nm.

An electron transporting layer was vapor deposited on the hole block layer. The electron transporting layer was formed by vapor deposition of a tris(8-quinolinolato)aluminum complex ($Alq_3$) by a resistance heating method in a vacuum (pressure: $1\times10^{-4}$ Pa), to an $Alq_3$ vapor deposition film thickness of 20 nm.

An electron injecting layer and a cathode were further vapor deposited in that order on the electron transporting layer of the fabricated structure (transparent anode-attached glass panel/ hole injecting layer/hole transporting layer/luminescent layer/hole block layer/electron transporting layer). Vapor deposition films were formed with LiF (thickness: 0.5 nm) for the electron injecting layer and with Al (thickness: 100 nm) for the cathode, in that order, by a resistance heating vapor deposition method in a vacuum (pressure: $1\times10^{-4}$ Pa).

After formation of the cathode, it was sealed in a low-oxygen, low-humidity glove box using non-alkaline glass and a UV curable epoxy adhesive, to fabricate an organic EL element for Example 1 comprising an anode patterned in mm width lines, and an electron injecting layer and cathode formed in mm width lines, perpendicularly crossing the anode.

Example 2

An organic EL element was fabricated in the same manner as Example 1, except that Mo clusters 2 were used as the hole injecting material for Example 1, and the hole injecting layer was formed as described below.
(Formation of Hole Injecting Layer)

After dissolving 0.04 g of $Na_{22}[Mo^{VI}_{118}Mo^{V}_{28}O_{442}H_{14}(H_2O)_{58}] \cdot ca.250H_2O$ (Mo clusters 2) in 10 g of distilled water to prepare a coating ink, the ink was used for formation by spin coating to a dry hole injecting layer film thickness of 10 nm. After forming the hole injecting layer coating film, a hot plate was used for evaporation of the moisture in the coated film, whereby the coating film was heat-dried at 200° C. for 10 minutes. The step of forming the hole injecting layer coating film and the step of drying the formed coating film were both carried out in air.

Example 3

An organic EL element was fabricated in the same manner as Example 1, except that a mixture of Mo clusters 1 and the aromatic amine compound N,N-bis-[4'-(hydroxy)[1,1'-biphenyl]-4-yl]-N-phenylamine (formula I) was used as the hole injecting material for Example 1, and the hole injecting layer was formed as described below.
(Formation of Hole Injecting Layer)

In order to form a mixed film of the chemically synthesized Mo clusters 1 and N,N-bis-[4'-(hydroxy)[1,1'-biphenyl]-4-yl]-N-phenylamine (formula I) as the hole injecting material, the Mo clusters 1 and the aromatic amine compound of formula I were combined in ethylene glycol at a weight ratio of 1:4 and heated at 150° C. for 3 hours for dissolution, and the solution was mixed with isopropyl alcohol in a weight ratio of 1:1 to prepare a coating ink.

The ink was used for coating by spin coating to a dry hole injecting layer film thickness of 10 nm, to form a coated film. After forming the hole injecting layer coating film, a hot plate was used for evaporation of the solvent in the coated film, whereby the coating film was heat-dried at 100° C. for 10 minutes. The step of forming the hole injecting layer coating film and the step of drying the formed coating film were both carried out in air.

Comparative Example 1

An organic EL element was fabricated in the same manner as Example 1, except that molybdenum trioxide was used as the hole injecting material for Example 1, and the hole injecting layer was formed as described below.
(Formation of Hole Injecting Layer)

A $MoO_3$ thin-film was vapor deposited as a hole injecting layer on a cleaned anode. The $MoO_3$ film was formed by vapor deposition by a resistance heating method in a vacuum (pressure: $1\times10^{-4}$ Pa), using $MoO_3$ as the vapor deposition material, to a vapor deposited film thickness of 10 nm.

Comparative Example 2

An organic EL element was fabricated in the same manner as Example 1, except that molybdenum trioxide and α-NPD were used as the hole injecting materials for Example 1, and the hole injecting layer was formed as described below.
(Formation of Hole Injecting Layer)

A mixed thin-film comprising $MoO_3$ and α-NPD was vapor deposited as a hole injecting layer on the cleaned anode. The mixed thin-film was formed by covapor deposition of a mixture of molybdenum trioxide and α-NPD in a volume ratio of 1:9 as the vapor deposition material, by a resistance heating method in a vacuum (pressure: $1\times10^{-4}$ Pa) to a total vapor deposition film thickness of 10 nm.

Comparative Example 3

An organic EL element was fabricated in the same manner as Example 3, except that the hole injecting layer used was a thin-film of an aromatic amine compound of formula I, instead of the mixed film of the chemically synthesized Mo clusters 1 and the aromatic amine compound of formula I in Example 3, and the aromatic amine compound of formula I was used as the hole injecting material for formation of the hole injecting layer as described below.

After heating and dissolving N,N-bis-[4'-(hydroxy)[1,1'-biphenyl]-4-yl]-N-phenylamine (formula I) in ethylene glycol at 150° C. for 3 hours, the solution was combined with isopropyl alcohol in a weight ratio of 1:1 to prepare a coating ink.

The coating ink was used for coating by spin coating to a dry hole injecting layer film thickness of 10 nm, to form a coated film. After forming the hole injecting layer coating film, a hot plate was used for evaporation of the solvent in the coated film, whereby the coating film was heat-dried at 100° C. for 10 minutes. The step of forming the hole injecting layer coating film and the step of drying the formed coating film were both carried out in air.

Example 4

An organic EL element was fabricated in the same manner as Example 1, except that the hole injecting material used for formation of the hole injecting layer in Example 1 was the chemically synthesized Mo clusters 1, and the hole transporting material used for formation of the hole transporting layer was the chemically synthesized Mo clusters 1 and the aromatic amine compound of formula I, and the hole injecting layer and hole transporting layer were formed as described below.

(Formation of Hole Injecting Layer)

As the hole injecting layer there was prepared a coating ink by dissolving 0.04 g of the chemically synthesized Mo clusters of Synthesis Method 1 in 10 g of distilled water, and the ink was used for formation by spin coating to a dry hole injecting layer film thickness of 5 nm. After forming the hole injecting layer coating film, a hot plate was used for evaporation of the moisture in the coated film, whereby the coating film was heat-dried at 200° C. for 10 minutes. The step of forming the hole injecting layer coating film and the step of drying the formed coating film were both carried out in air.

(Formation of Hole Transporting Layer)

After vapor depositing an α-NPD thin-film as the hole transporting layer in the same manner as Example 1 on a formed hole injecting layer, in order to form a mixed film of chemically synthesized Mo clusters 1 and N,N-bis-[4'-(hydroxy)[1,1'-biphenyl]-4-yl]-N-phenylamine (formula I) as the hole transporting layer on the hole transporting layer, the Mo clusters 1 and the aromatic amine compound of formula I were combined in ethylene glycol at a weight ratio of 1:4 and heated at 150° C. for 3 hours for dissolution, and the solution was mixed with isopropyl alcohol in a weight ratio of 1:1 to prepare a coating ink.

The ink was used for coating by spin coating to a dry hole transporting layer film thickness of 5 nm, to form a coated film. After forming the hole transporting layer coating film, a hot plate was used for evaporation of the solvent in the coated film, whereby the coating film was heat-dried at 100° C. for 10 minutes. The step of forming the hole transporting layer coating film and the step of drying the formed hole transporting layer were both carried out in air.

The organic EL elements fabricated in the examples and comparative examples all emitted green light from the luminescent dopant Ir(ppy)$_3$. The current efficiency, and the applied voltage during driving and lifetime characteristic of the organic EL elements, were determined by measuring the applied voltage and luminescent brightness upon driving of the organic EL elements at 10 mA/cm$^2$, and calculating the luminous efficiency (cd/A) based on the obtained values, yielding the results shown in Table 2.

The lifetime characteristic of the organic EL element was evaluated by observing the condition of gradually reduced brightness with constant current driving. The decay in brightness was recorded while maintaining a constant current density after driving at an initial brightness of 20,000 (cd/m$^2$), and the time (hr) to half-brightness was recorded as the lifetime (half-life time).

TABLE 2

| | Hole injecting layer | Hole transporting layer 1 | Hole transporting layer 2 | Voltage (V) | Brightness (cd/m$^2$) | Current efficiency (cd/A) | Time to half-brightness (hr.) |
|---|---|---|---|---|---|---|---|
| Example 1 | Mo clusters 1 (10 nm) | α-NPD | None | 8.5 | 3260 | 33 | 32 |
| Example 2 | Mo clusters 2 (10 nm) | α-NPD | None | 8.5 | 3310 | 33 | 31 |
| Example 3 | Mo clusters 1: amine compound (10 nm) | α-NPD | None | 8.8 | 3260 | 33 | 30 |
| Example 4 | Mo clusters 1 (5 nm) | α-NPD | Mo clusters 1: amine compound (5 nm) | 8.7 | 3306 | 33 | 32 |
| Comp. Ex. 1 | MoO$_3$ vapor deposition film (10 nm) | α-NPD | None | 8.3 | 3469 | 35 | 20 |
| Comp. Ex. 2 | MoO$_3$:NPD (1:9) covapor deposition film (total film thickness: 10 nm) | α-NPD | None | 8.2 | 3460 | 35 | 26 |
| Comp. Ex. 3 | Amine compound (10 nm) | α-NPD | None | 9.4 | 3550 | 36 | 12 |

[Summary of Results]

Comparison between Example 1 and Comparative Example 1 shows that the lifetime of Mo clusters 1 was 1.6 times longer than the MoO$_3$ film (10 nm). The results suggest that $Mo^V$ stably exists in the film, resulting in increased driving stability. Comparison between Example 2 and Comparative Example 1 shows that the lifetime of Mo clusters 2 was 1.55 times longer than the $MoO_3$ film (10 nm). These results also suggest that $Mo^V$ stably exists in the film, resulting in increased driving stability. Comparison between Example 3 and Comparative Example 1 and between Example 3 and Comparative Example 3 shows that the lifetime of the element employing a mixed film of Mo clusters 1 and aromatic amine compound (formula I) was 1.5 times longer than the $MoO_3$ film (10 nm), and that the lifetime of the element employing a mixed film of Mo clusters 1 and the aromatic amine compound (formula I) was 2.5 times longer than the amine compound film (10 nm). The results indicate that using a mixed film of Mo clusters 1 and an aromatic amine compound can improve film formability and allow control of the ink properties (surface tension, viscosity and the like). That is, the hole injecting material exhibits both performance and film formability. Furthermore, the stable presence of $Mo^V$ in the film, even as a mixed film in combination with an organic material, presumably improved the driving stability.

Comparison between Example 4 and Comparative Example 1 shows that the element having a mixed film of Mo clusters 1 and the amine compound inserted as a hole transporting layer had lifetime which was 1.5 times longer than the $MoO_3$ film (10 nm). The results indicate that using a mixed film of Mo clusters 1 and an aromatic amine compound can improve film formability and allow easy adjustment of the ink properties (surface tension, viscosity and the like). It was demonstrated to be a hole injecting/transporting material exhibiting both the performance and film formability as a material for formation of a hole injecting layer and/or hole transporting layer in an organic electronic device. Also, presumably, the stable existence of $Mo^V$ in the film resulted in increased driving stability.

Comparison between Example 1 and Comparative Example 2 indicates a lifetime that is 1.23 times longer. The results suggest that the driving stability was increased due to the stable existence of $Mo^V$ in the film.

Example 5

An organic EL element was fabricated in the same manner as Example 1, except that the hole transporting layer and luminescent layer in Example 1 were formed using, respectively, poly[(9,9-dioctylfluorenyl-2,7-diyl)-co-(4,4'-(N-(4-sec-butylphenyl))diphenylamine)] (TFB) instead of α-NPD as the hole-transporting material, and as the material for formation of the luminescent layer, 1-tert-butylperylene (TBP) as the luminescent dopant and 2-methyl-9,10-bis (naphthalen-2-yl)anthracene (MADN) as the host, instead of $Ir(ppy)_3$ as the luminescent dopant and 4,4'-bis(2,2-carbazol-9-yl)biphenyl (CBP) as the host, as described below.
(Formation of Hole Transporting Layer)

The hole transporting layer was formed by spin coating a solution of poly[(9,9-dioctylfluorenyl-2,7-diyl)-co-(4,4'-(N-(4-sec-butylphenyl))diphenylamine)] (TFB) in xylene at a 0.7 wt % concentration, as a coating film on the hole injecting layer, to a dry hole transporting layer film thickness of 30 nm. After forming the hole transporting layer coating film, a hot plate was used for evaporation of the solvent in the coated film, for heat drying at 200° C. for 30 minutes.
(Formation of Luminescent Layer)

The luminescent layer was then formed as a coating film on the hole transporting layer, from a solution of 2-methyl-9,10-bis(naphthalen-2-yl)anthracene (MADN) and 1-tert-butylperylene (TBP) in toluene at a weight ratio of 20:1 as solid content, dissolved to a solid concentration of 1.0 wt %, by spin coating to a dry luminescent layer film thickness of 40 nm. After forming the luminescent layer coating film, a hot plate was used for evaporation of the solvent in the coated film, for heat drying at 100° C. for 10 minutes. The fabricated element emitted blue light, as the luminescence of TBP.

Example 6

An organic EL element was fabricated in the same manner as Example 5, except that a mixture of PEDOT/PSS and Mo clusters 1 was used to form the hole injecting layer in Example 5, instead of Mo clusters 1, as described below.
(Formation of Hole Injecting Layer)

The hole injecting layer was a thin-film comprising PEDOT/PSS, obtained by mixing 1 g of CLEVIOS™ P AI4083 ink by Starck, as the PEDOT/PSS, with an aqueous solution of 0.004 g of Mo clusters 1 dissolved in 1 g of distilled water, to prepare a 2 g solution, and forming a coating film on the electrode by spin coating to a dry hole injecting layer film thickness of 20 nm. After forming the hole injecting layer, a hot plate was used for evaporation of the solvent in the coated film, whereby the coating film was heat-dried at 200° C. for 10 minutes.

Comparative Example 4

An organic EL element was fabricated in the same manner as Example 6, except that the hole injecting layer in Example 6 was a coated thin-film (20 nm) of PEDOT/PSS alone.

The PEDOT/PSS thin-film was formed by mixing 1 g of CLEVIOS™ P AI4083 ink by Starck and 1 g of distilled water to prepare a 2 g solution, and coating it by spin coating. After coating the solution, a hot plate was used for evaporation of the solvent, for heat drying at 200° C. for 10 minutes.

Comparative Example 5

An organic EL element was fabricated in the same manner as Example 3, except that the hole injecting layer in Example 5 was formed by coating the $MoO_3$ slurry prepared in the comparative synthesis example. The solid content of the slurry in the comparative synthesis example was unknown, but after forming the film by spin coating and coating the slurry, the film thickness was measured to be approximately 10 nm. A hot plate was used for evaporation of the solvent in the coated film and heat drying at 100° C. for 10 minutes, upon which slight opacity was produced. The fabricated element emitted blue light, as the luminescence of TBP, but numerous shorts occurred.

The organic EL elements fabricated in the examples and comparative examples all employed 1-tert-butyl-perylene (TBP) as the luminescent dopant and 2-methyl-9,10-bis (naphthalen-2-yl)anthracene (MADN) as the host, and emitted blue light from TBP as the luminescent dopant. The current efficiency, and the applied voltage during driving and lifetime characteristic of the organic EL elements, were determined by measuring the applied voltage and luminescent brightness upon driving of the organic EL elements at 10 $mA/cm^2$, and calculating the luminous efficiency (cd/A) based on the obtained values, yielding the results shown in Table 3.

The lifetime characteristic of the organic EL element was evaluated by observing the condition of gradually reduced brightness with constant current driving. The decay in brightness was recorded while maintaining a constant current density after driving at an initial brightness of 20,000 (cd/m$^2$), and the time (hr) to half-brightness was recorded as the lifetime (half-life time).

TABLE 3

|  | Hole injecting layer | Hole transporting layer 1 | Hole transporting layer 2 | Voltage (V) | Brightness (cd/m$^2$) | Current efficiency (cd/A) | Time to half-brightness (hr.) |
|---|---|---|---|---|---|---|---|
| Example 5 | Mo clusters 1 (10 nm) | TFB | None | 7.8 | 123 | 1.2 | 62 |
| Example 6 | Mo clusters 1 (10 nm): PEDOT/PSS | TFB | None | 8.5 | 118 | 1.2 | 55 |
| Comp. Ex. 4 | PEDOT/PSS | TFB | None | 8.3 | 110 | 1.1 | 15 |
| Comp. Ex. 5 | MoO$_3$ slurry | TFB | None | 8.5 | 85 | 0.7 | 10 |

[Summary of Results]

Comparison between Example 5 and Comparative Example 4 indicates that Example 5 had a dramatically longer lifetime. The PEDOT/PSS of Comparative Example 4 is a material commonly used as a hole injecting material for coating in organic ELs, and therefore the hole injecting material exhibits very high performance.

Comparison between Example 6 and Comparative Example 4 indicates that Example 6 had a dramatically longer lifetime. On the other hand, comparison between Example 5 and Example 6 indicates that Example 6 had a somewhat shorter lifetime, but that the mixed film of PEDOT/PSS provides the advantage of improving the film formability and allowing the ink properties (surface tension, viscosity and the like) to be controlled. That is, the hole injecting material exhibits both performance and film formability.

Since the Mo clusters 1 of the invention are water-soluble, formation of a mixed film was possible. The Na ion in PEDOT/PSS is generally considered to shorten lifetime, and inventions that remove the ion component have been reported, but in contradiction to this common knowledge, the present invention achieves an extended lifetime by mixing Mo clusters of anions counter to Na cation with PEDOT/PSS, thus offering new possibilities for materials that can increase performance of organic electronic devices.

Comparison between Example 5 and Comparative Example 5 indicates that the element of Example 5 exhibited lower voltage driving and an extended lifetime. The Mo nanoparticles of the invention have higher particle size uniformity than a physically pulverized MoO$_3$ slurry, and it is believed that the pentavalent and hexavalent molybdenum homogeneously dispersed in the film contribute to the lower voltage or longer lifetime. For Comparative Example 5, particle size distribution measurement allowed confirmation of fine dispersion at about 25 nm, but due to opacity of the thin-film, it was concluded that aggregation had tended to occur during film formation, or that the ink itself had low dispersion stability.

The reason for the significantly increased element lifetime when using a hole injecting layer and/or hole transporting layer of the invention is thought to be due to the difference in stability or strength and percentage of interaction of the molybdenum oxidation number of +5.

Example 7

The substrate used was prepared by coating a photosensitive resist onto the ITO anode of an ITO-attached glass panel (product of Sanyo Vacuum Industries Co., Ltd., ITO film thickness: 150 nm) and performing mask exposure, development and etching for strip pattern formation to obtain a patterned ITO substrate, and this was subjected to ultrasonic cleaning with a neutral cleanser and ultrapure water in that order, and to UV ozone treatment.

Next, a mixture of the polyoxometalate phosphomolybdic acid hydrate $H_3[PMo_{12}O_{40}] \cdot nH_2O$ [n≈30] (hereunder referred to as "Mo clusters 4") and the aromatic amine compound N,N-bis-[4'-(hydroxy) [1,1'-biphenyl]-4-yl]-N-phenylamine (formula I) was used for formation of a hole injecting layer on an ITO-attached glass panel. The coating ink as the hole injecting layer-forming coating solution was prepared by dissolving a mixture of 0.04 g of a powder sample of molybdenum clusters 4 (product of Nippon Inorganic Colour & Chemical Co., Ltd.) and the aromatic amine compound N,N-bis-[4'-(hydroxy)[1,1'-biphenyl]-4-yl]-N-phenylamine (formula I) in a weight ratio of 1:1, in 10 g of isopropyl alcohol to form a mixed film. The coating ink, filtered with a 0.2 μm filter, was used for coating by spin coating onto a cleaned anode to a dry hole injecting layer film thickness of 10 nm, to form a hole injecting layer coating film. After forming the coated film, a hot plate was used for evaporation of the moisture in the thin-film, for heat drying of the coated film at 200° C. for 10 minutes. The step of forming the hole injecting layer coating film and the step of drying the formed coating film were both carried out in air.

A hole transporting layer was formed by coating polyvinylcarbazole (hereunder, "PVK", molecular weight: approximately 60,000) as the hole transporting material on the hole injecting layer. The coating ink, as the hole transporting layer-forming coating solution, was prepared by dissolving 0.005 g of PVK sample (product of Takasago Intl. Corp.) in 1 g of xylene as the solvent. The coating ink, filtered with a 0.2 μm filter, was used for coating by spin coating onto a cleaned anode to a dry hole transporting layer film thickness of 10 nm, to form a hole transporting layer coating film. After forming the coated film, a hot plate was used for evaporation of the solvent in the coated film, for heat drying of the coating film at 150° C. for 10 minutes. The step of forming the coated film of the hole transporting layer and the step of drying the formed coating film were both carried out in a glove box (oxygen concentration: <1 ppm, moisture concentration: <1 ppm).

The luminescent layer was then coated onto the hole transporting layer. The luminescent layer was formed by using a mixed coating solution comprising CBP as the host and tris[2-(p-tolyl)pyridine]iridium(III) (hereunder, "Ir(mppy)$_3$") as the luminescent dopant, as a coating ink for coating formation of the luminescent layer. The coating ink, as the luminescent layer-forming mixed coating solution, was prepared by dissolving 0.01 g of CBP (product of Nippon Steel Chemical Co., Ltd.) and 0.002 g of Ir(mppy)$_3$ (Grade Product No., trade name of Lumtec) in 1 g of toluene as the solvent. The coating ink was used for coating by spin coating onto a cleaned anode to a dry luminescent layer film thickness of 40 nm, to form a luminescent layer coating film. After forming the coated film, a hot plate was used for evaporation of the solvent in the thin-film, for heat drying of the coated film at 100° C. for 10 minutes. The step of forming the coated film of the luminescent layer and the step of drying the formed coating film were both carried out in a glove box (oxygen concentration: <1 ppm, moisture concentration: <1 ppm).

The hole block layer was vapor deposited on the luminescent layer. An electron transporting layer was vapor deposited on the hole block layer. The electron transporting layer was formed by vapor deposition of a tris(8-quinolinolato)aluminum complex (Alq$_3$) by a resistance heating method in a vacuum (pressure: 1×10$^{-4}$ Pa), to an Alq$_3$ vapor deposition film thickness of 20 nm.

An electron injecting layer and a cathode were further vapor deposited in that order on the electron transporting layer of the fabricated structure (transparent anode-attached glass panel/ hole injecting layer/hole transporting layer/luminescent layer/hole block layer/electron transporting layer). Vapor deposition films were formed with LiF (thickness: 0.5 nm) for the electron injecting layer and with Al (thickness: 100 nm) for the cathode, in that order, by a resistance heating vapor deposition method in a vacuum (pressure: 1×10$^{-4}$ Pa).

After formation of the cathode, it was sealed in a low-oxygen, low-humidity glove box using non-alkaline glass and a UV curable epoxy adhesive, to fabricate an organic EL element for Example 7 comprising an anode patterned in 2 mm width lines, and an electron injecting layer and cathode formed in 2 mm width lines, perpendicularly crossing the anode.

Example 8

An organic EL element was fabricated in the same manner as Example 7, except that a mixture comprising silicon molybdic acid hydrate; H$_4$[SiMo$_{12}$O$_{40}$].nH$_2$O [n≈30] (hereunder, "Mo clusters 5") and an aromatic amine compound of formula I in a weight ratio of 1:4, as the hole injecting material in Example 7, was dissolved in isopropyl alcohol to prepare a coating ink, and a coating film of the hole injecting layer was formed.
(Formation of Hole Injecting Layer)

A mixture comprising 0.04 g of a powder sample of the Mo cluster 5 and an aromatic amine compound of formula I in a weight ratio of 1:1 was dissolved in 10 g of isopropyl alcohol to prepare a coating ink, and the coating ink was filtered with a 0.2 μm filter and then coated onto the anode by spin coating to a dry hole injecting layer film thickness of 10 nm, to form a coating film of the hole injecting layer.

Example 9

An organic EL element was fabricated in the same manner as Example 7, except that a mixture comprising phosphovanadomolybdic acid hydrate; H$_4$[PVMo$_{11}$O$_{40}$].nH$_2$O (hereunder, "Mo clusters 6") and an aromatic amine compound of formula I in a weight ratio of 1:4, as the hole injecting material in Example 7, was dissolved in isopropyl alcohol to prepare a coating ink, and a coating film of the hole injecting layer was formed.
(Formation of Hole Injecting Layer)

A mixture comprising 0.04 g of a powder sample of the Mo cluster 6 and an aromatic amine compound of formula I in a weight ratio of 1:1 was dissolved in 10 g of isopropyl alcohol to prepare a coating ink, and the coating ink was filtered with a 0.2 μm filter and then coated onto the anode by spin coating to a dry hole injecting layer film thickness of 10 nm, to form a coating film of the hole injecting layer. After forming the coated film, a hot plate was used for evaporation of the solvent in the coated film, for heat drying of the coating film at 200° C. for 10 minutes.

Example 10

An organic EL element was fabricated in the same manner as Example 7, except that a mixture comprising phosphotungstic acid hydrate; H$_3$[PW$_{12}$O$_{40}$].nH$_2$O [n≈7] (hereunder, "W clusters 1") and an aromatic amine compound of formula I in a weight ratio of 1:4, as the hole injecting material in Example 7, was dissolved in isopropyl alcohol to prepare a coating ink, and a coating film of the hole injecting layer was formed.
(Formation of Hole Injecting Layer)

A mixture comprising 0.04 g of a powder sample of the W clusters 1 and an aromatic amine compound of formula I in a weight ratio of 1:1 was dissolved in 10 g of isopropyl alcohol to prepare a coating ink, and the coating ink was filtered with a 0.2 μm filter and then coated onto the anode by spin coating to a dry hole injecting layer film thickness of 10 nm, to form a coating film of the hole injecting layer. After forming the coated film, a hot plate was used for evaporation of the solvent in the coated film, for heat drying of the coating film at 200° C. for 10 minutes.

Example 11

An organic EL element was fabricated in the same manner as Example 7, except that a mixture comprising silicotungstic acid hydrate; H$_4$[SiW$_{12}$O$_{40}$].nH$_2$O [n≈24] (hereunder, "W clusters 2") and an aromatic amine compound of formula I in a weight ratio of 1:1, as the hole injecting material in Example 7, was dissolved in isopropyl alcohol to prepare a coating ink, and a coating film of the hole injecting layer was formed.
(Formation of Hole Injecting Layer)

A mixture comprising 0.04 g of a powder sample of the W clusters 2 and an aromatic amine compound of formula I in a weight ratio of 1:1 was dissolved in 10 g of isopropyl alcohol to prepare a coating ink, and the coating ink was filtered with a 0.2 μm filter and then coated onto the anode by spin coating to a dry hole injecting layer film thickness of 10 nm, to form a coating film of the hole injecting layer. After forming the coated film, a hot plate was used for evaporation of the solvent in the coated film, for heat drying of the coating film at 200° C. for 10 minutes.

Example 12

An organic EL element was fabricated in the same manner as Example 7, except that a mixture comprising phosphovanadotungstic acid hydrate; H$_4$[PV$_2$W$_{10}$O$_{40}$].nH$_2$O (hereunder, "W clusters 3") and an aromatic amine compound of formula I in a weight ratio of 1:4, as the hole injecting material in Example 7, was dissolved in isopropyl alcohol to prepare a coating ink, and a coating film of the hole injecting layer was formed.
(Formation of Hole Injecting Layer)

A mixture comprising 0.04 g of a powder sample of the W clusters 3 and an aromatic amine compound of formula I in a weight ratio of 1:4 was dissolved in 10 g of isopropyl alcohol to prepare a coating ink, and the coating ink was filtered with a 0.2 μm filter and then coated onto the anode by spin coating to a dry hole injecting layer film thickness of 10 nm, to form a coating film of the hole injecting layer. After forming the coated film, a hot plate was used for evaporation of the solvent in the coated film, for heat drying of the coating film at 200° C. for 10 minutes. [Comparative Examples 6, 7, 8 and 9]

The fabrication methods for Comparative Examples 6, 7, 8 and 9 were the same as the method as Example 7, after forming hole injecting layers by exactly the same methods as Comparative Examples 1-3.

The organic EL elements fabricated in Examples 7-12 were all organic EL elements fabricated using Ir(mppy)$_3$ as the luminescent dopant and 4,4'-bis(2,2-carbazol-9-yl)biphenyl (CBP) as the host, as the materials for forming the luminescent layers. Green light was emitted from Ir(mppy)$_3$ as the luminescent dopant. The current efficiency, and the applied voltage during driving and lifetime characteristic of the organic EL elements, were determined by measuring the applied voltage and luminescent brightness upon driving of the organic EL elements at 10 mA/cm$^2$, and calculating the luminous efficiency (cd/A) based on the obtained values, yielding the results shown in Table 4.

The lifetime characteristic of the organic EL element was evaluated by observing the condition of gradually reduced brightness with constant current driving. The decay in brightness was recorded while maintaining a constant current density after driving at an initial brightness of 2000 (cd/m$^2$), and the time (hr) to half-brightness was recorded as the lifetime (half-life time).

clusters, in the hole injecting layers of the organic electronic devices, employing clusters of complex alloy oxides of Mo and phosphorous (P), Mo and silicon (Si), and Mo, phosphorus and vanadium (V). Similarly, the performance of organic electronic devices employing tungsten-based low-molecular clusters in the hole injecting layer was also examined, as Examples 10 to 12.

When metal oxide clusters that are polyoxometalates of the invention were used in the hole injecting layer of an organic electronic device, in comparison to the performance of organic electronic devices known in the prior art, illustrated in Comparative Examples 6 to 9, increased brightness overall and a definite extension of lifetime to over 1.8-fold were exhibited with application of approximately the same applied voltage, in the case of molybdenum-based clusters, while in the case of tungsten-based clusters, though in terms of applied voltage the voltage application was slightly higher than for a molybdenum-based slurry or vapor deposition film, and the brightness was lower, in terms of the lifetime as measured by time to half-brightness, the mixed film of tungsten clusters and the amine compound were highly superior in terms of lifetime, compared to conventional molybdenum vapor deposition films, slurries and amine compounds used alone in hole injecting layers.

Furthermore, with a complex film comprising an amine compound, it is possible to obtain a flat, homogeneous coated film and control the physical properties of the coating ink, more satisfactorily than with a heteropolyacid alone. In addition, it is conjectured that a mixed film has a stabilized mixed valence state, which thus results in a longer driving lifetime than ordinary Mo oxide.

TABLE 4

|  | Hole injecting layer | Hole transporting layer 1 | Hole transporting layer 2 | Voltage (V) | Brightness (cd/m$^2$) | Current efficiency (cd/A) | Time to half-brightness (hr.) |
|---|---|---|---|---|---|---|---|
| Example 7 | Amine compound of formula I: Mo clusters 4 | PVK | None | 6.6 | 470 | 4.7 | 52 |
| Example 8 | Amine compound of formula I: Mo clusters 5 (10 nm) | PVK | None | 6.7 | 481 | 4.8 | 52 |
| Example 9 | Amine compound of formula I: Mo clusters 6 (10 nm) | PVK | None | 6.4 | 513 | 5.1 | 45 |
| Example 10 | Amine compound of formula I: W clusters 1 (10 nm) | PVK | None | 7.2 | 435 | 4.4 | 40 |
| Example 11 | Amine compound of formula I: W clusters 2 (10 nm) | PVK | None | 7.4 | 398 | 4.0 | 48 |
| Example 12 | Amine compound of formula I: W clusters 3 (10 nm) | PVK | None | 7.0 | 439 | 4.4 | 50 |
| Comp. Ex. 6 | Mo slurry | PVK | None | 7.8 | 232 | 2.3 | 9 |
| Comp. Ex. 7 | MoO$_3$ vapor deposition film (10 nm) | PVK | None | 6.7 | 450 | 4.5 | 25 |
| Comp. Ex. 8 | MoO$_3$:NPD (1:9) covapor deposition film (total film thickness: 10 nm) | PVK | None | 6.9 | 388 | 3.9 | 22 |
| Comp. Ex. 9 | Amine compound of formula I: | PVK | None | 8.4 | 210 | 2.1 | <1 |

[Summary of Results]

Examples 7 to 9 employed polyoxometalates as the metal oxide clusters, which were Mo cluster-based low-molecular The element lifetime can also be significantly lengthened when low-molecular metal oxide clusters of the invention are used in the hole injecting layer and/or hole transporting layer.

INDUSTRIAL APPLICABILITY

Organic electronic devices employing organic materials are expected to have applications in a wide range of basic elements and uses such as organic electroluminescence elements, organic transistors, organic solar cells and the like, and also quantum dot light emitting elements having hole injecting transporting layers, and oxide-based compound solar cells.

REFERENCE SIGNS LIST

1 Electrode (anodic electrode)
2 Hole injecting layer or 2b hole injecting transporting layer
3 Organic functional layer
4a Hole transporting layer (hole-transporting material alone)
4b Hole transporting layer (containing Mo clusters)
5 Luminescent layer
6 Electrode (cathodic electrode)
7 Substrate
8 Organic transistor layer
9 Electrode
10 Insulating layer

The invention claimed is:

1. An organic electronic device comprising two or more electrodes facing each other on a substrate, and an organic functional layer that includes a hole injecting layer and optionally a hole transporting layer situated between the electrodes,
wherein the hole injecting layer is a layer comprising molybdenum oxide clusters selected from the group consisting of $\{Mo_{132}\}$, $\{Mo_{142}\}$, $\{Mo_{146}\}$, $\{Mo_{154}\}$, $\{Mo_{176}\}$, $\{Mo_{248}\}$ and $\{Mo_{368}\}$, wherein the molybdenum oxide clusters are mixed valence polyoxometalates, and wherein the hole injecting layer is a layer formed as a thin-film from a fluid material comprising an aqueous medium containing the molybdenum oxide clusters.

2. The organic electronic device according to claim 1, wherein the layer situated between two electrodes further comprises a hole transporting layer.

3. The organic electronic device according to claim 1, wherein the hole injecting layer and the optional hole transporting layer comprises the molybdenum oxide clusters and an aromatic amine-based compound as the hole transporting material.

4. The organic electronic device according to claim 1, wherein the hole injecting layer and the optional hole transporting layer is a layer comprising the molybdenum oxide clusters, formed as a thin-film from a coating ink that comprises the molybdenum oxide clusters and an aromatic amine-based compound as a hole transporting material, both of which are contained in either a water or an alcohol based medium.

5. The organic electronic device according to claim 1, wherein the molybdenum oxide clusters are chemically synthesized anionic molecules, wherein a structure of each molecule is no larger than 10 nm.

6. The organic electronic device according to claim 1, wherein the hole injecting layer and the optional hole transporting layer comprises an aromatic amine compound represented by formula I: N,N-bis-[4'-(hydroxy)[1,1'-biphenyl]-4-yl]-N-phenylamine, as a hole transporting material.

7. The organic electronic device according to claim 1, wherein the organic electronic device is an organic EL element, and the organic functional layer includes a luminescent layer.

8. A method for producing an organic electronic device comprising two or more electrodes facing each other on a substrate, and an organic functional layer that includes a hole injecting layer and optionally a hole transporting layer situated between the electrodes,
the method comprising a step of forming the hole injecting layer, wherein the hole injecting layer is a layer comprising molybdenum oxide clusters selected from the group consisting of $\{Mo_{132}\}$, $\{Mo_{142}\}$, $\{Mo_{146}\}$, $\{Mo_{154}\}$, $\{Mo_{176}\}$, $\{Mo_{248}\}$ and $\{Mo_{368}\}$, wherein the molybdenum oxide clusters are mixed valence polyoxometalates, in which step a fluid material comprising the molybdenum oxide clusters is formed into a laminar shape, and
wherein the fluid material is an aqueous medium containing molybdenum oxide clusters.

9. The method for producing an organic electronic device according to claim 8, wherein the step of forming the hole injecting layer and optionally the hole transporting layer includes a step of forming the fluid material containing the molybdenum oxide clusters into a laminar shape by a coating method.

10. The method for producing an organic electronic device according to claim 8, wherein the step of forming the hole injecting layer and optionally the hole transporting layer is accomplished by spin coating, dipping, ink-jet method or gravure printing.

11. The method for producing an organic electronic device according to claim 8, wherein the fluid material is a uniform dissolution, or a uniform dispersion or mixture, containing the molybdenum oxide clusters.

12. The method for producing an organic electronic device according to claim 8, wherein the fluid material contains the molybdenum oxide clusters and an aromatic amine-based compound as a hole transporting material.

13. The method for producing an organic electronic device according to claim 8, wherein the fluid material is a coating ink that comprises the molybdenum oxide clusters and an aromatic amine-based compound as a hole transporting material, both of which are contained in either a water or an alcohol based medium.

14. The method for producing an organic electronic device according to claim 8, wherein the fluid material contains an aromatic amine compound represented by formula I: N,N-bis-[4'-(hydroxy)[1,1'-biphenyl]-4-yl]-N-phenylamine, as a transporting material.

15. The method for producing an organic electronic device according to claim 8, wherein the organic electronic device is an organic EL element, and the organic functional layer includes a luminescent layer.

* * * * *